US008231726B2

(12) United States Patent
Minemoto et al.

(10) Patent No.: US 8,231,726 B2
(45) Date of Patent: Jul. 31, 2012

(54) SEMICONDUCTOR LIGHT EMITTING ELEMENT, GROUP III NITRIDE SEMICONDUCTOR SUBSTRATE AND METHOD FOR MANUFACTURING SUCH GROUP III NITRIDE SEMICONDUCTOR SUBSTRATE

(75) Inventors: Hisashi Minemoto, Osaka (JP); Yasuo Kitaoka, Osaka (JP); Yasutoshi Kawaguchi, Hyogo (JP); Yasuhito Takahashi, Osaka (JP); Yoshiaki Hasegawa, Shiga (JP)

(73) Assignee: Panasonic Corporation, Osaka (JP)

( * ) Notice: Subject to any disclaimer, the term of this patent is extended or adjusted under 35 U.S.C. 154(b) by 1014 days.

(21) Appl. No.: 12/161,393

(22) PCT Filed: Jan. 19, 2007

(86) PCT No.: PCT/JP2007/050837
§ 371 (c)(1),
(2), (4) Date: Jul. 18, 2008

(87) PCT Pub. No.: WO2007/083768
PCT Pub. Date: Jul. 26, 2007

(65) Prior Publication Data
US 2010/0230713 A1   Sep. 16, 2010

(30) Foreign Application Priority Data
Jan. 20, 2006   (JP) ................. 2006-011975

(51) Int. Cl.
*H01L 33/30* (2010.01)
*C30B 19/02* (2006.01)
*C30B 19/04* (2006.01)
(52) U.S. Cl. ............... 117/73; 117/64; 117/78; 438/45; 438/495; 438/499; 438/501; 257/103; 257/616; 257/E33.029; 257/E33.03

(58) Field of Classification Search ............ 257/79–103, 257/613–616, E33.029; 117/54–67, 73–83; 438/22–98, 478–569
See application file for complete search history.

(56) References Cited

U.S. PATENT DOCUMENTS
4,077,019 A    2/1978  Steifer et al.
(Continued)

FOREIGN PATENT DOCUMENTS
EP    1 335 434    8/2003
(Continued)

OTHER PUBLICATIONS
"N-type doping of wurtzite GaN with germanium grown with plasma-assisted molecular beam epitaxy" P.R. Hageman et al., Journal of Crystal Growth 267 (2004) 123-128.*
(Continued)

*Primary Examiner* — Kiesha Bryant
*Assistant Examiner* — Eric Ward
(74) *Attorney, Agent, or Firm* — Hamre, Schumann, Mueller & Larson, P.C.

(57) ABSTRACT

An object of the present invention is to obtain, with respect to a semiconductor light-emitting element using a group III nitride semiconductor substrate, a semiconductor light-emitting element having an excellent light extraction property by selecting a specific substrate dopant and controlling the concentration thereof. The semiconductor light-emitting element comprises a substrate composed of a group III nitride semiconductor comprising germanium (Ge) as a dopant, an n-type semiconductor layer composed of a group III nitride semiconductor formed on the substrate, an active layer composed of a group III nitride semiconductor formed on the n-type semiconductor layer, and a p-type semiconductor layer composed of a group III nitride semiconductor formed on the active layer in which the substrate has a germanium (Ge) concentration of $2\times10^{17}$ to $2\times10^{19}$ cm$^{-3}$. The substrate is produced in a nitrogen-containing atmosphere using a melt comprising at least a group III element, an alkali or alkaline earth metal, and germanium (Ge) and nitrogen.

26 Claims, 11 Drawing Sheets

U.S. PATENT DOCUMENTS

| | | | |
|---|---|---|---|
| 6,273,948 B1 * | 8/2001 | Porowski et al. | 117/77 |
| 6,413,627 B1 | 7/2002 | Motoki et al. | |
| 6,586,777 B1 * | 7/2003 | Yuasa et al. | 257/103 |
| 6,949,140 B2 | 9/2005 | Sarayama et al. | |
| 7,410,540 B2 * | 8/2008 | Kretzer et al. | 117/81 |
| 7,883,645 B2 * | 2/2011 | Friedrich et al. | 252/521.5 |
| 8,084,281 B2 * | 12/2011 | Shibata et al. | 438/22 |
| 2002/0046695 A1 | 4/2002 | Sarayama et al. | |
| 2004/0057487 A1 | 3/2004 | Nomura et al. | |
| 2004/0134413 A1 * | 7/2004 | Iwata et al. | 117/2 |
| 2005/0042787 A1 * | 2/2005 | Ito et al. | 438/41 |
| 2005/0082564 A1 * | 4/2005 | Kitaoka et al. | 257/103 |
| 2006/0037529 A1 * | 2/2006 | D'Evelyn et al. | 117/36 |
| 2006/0051942 A1 * | 3/2006 | Sasaki et al. | 438/483 |
| 2006/0054076 A1 | 3/2006 | Dwilinski et al. | |
| 2006/0169197 A1 | 8/2006 | Sasaki et al. | |
| 2006/0169996 A1 * | 8/2006 | D'Evelyn et al. | 257/94 |
| 2006/0255339 A1 * | 11/2006 | Lee et al. | 257/76 |
| 2006/0256825 A1 | 11/2006 | Matsumura et al. | |

FOREIGN PATENT DOCUMENTS

| | | |
|---|---|---|
| JP | 2000-12900 | 1/2000 |
| JP | 2001-148540 | 5/2001 |
| JP | 2002-293696 | 10/2002 |
| JP | 2003-206198 | 7/2003 |
| JP | 2003-300798 | 10/2003 |
| JP | 2004-111853 | 4/2004 |
| JP | 2004-300024 | 10/2004 |
| JP | 2005-45239 | 2/2005 |
| JP | 2005-175056 | 6/2005 |
| JP | 2005-213075 | 8/2005 |
| JP | 2005-225681 | 8/2005 |
| JP | 2006-315949 | 11/2006 |
| WO | 2004/061923 | 7/2004 |
| WO | 2004/013385 | 12/2004 |
| WO | WO 2005114754 A1 * | 12/2005 |

OTHER PUBLICATIONS

Nakamura, et al. "Si- and Ge-Doped GaN Films Grown with GaN Buffer Layers", Jpn. J. Appl. Phys. vol. 31 (1992), pp. 2883-2888.

Götz, et al., "Hall-effect characterization of III-V nitride semiconductors for high efficiency light emitting diodes", Materials Science and Engineering B59 (1999) 211-217.

* cited by examiner

|  | Growth rate | Generation of heterogeneous nucleation | Reproducibility | Solvent effect |
|---|---|---|---|---|
| Si dope | Decreased | No | △ | No |
| Ge dope | Increased | Yes | ◎ | Yes |

FIG. 4

Absorption coefficient of substrate: small
( Absorption coefficient ~10cm$^{-1}$ )

Absorption coefficient of substrate: large
( Absorption coefficient 70cm$^{-1}$ )

SEMICONDUCTOR LIGHT EMITTING ELEMENT, GROUP III NITRIDE SEMICONDUCTOR SUBSTRATE AND METHOD FOR MANUFACTURING SUCH GROUP III NITRIDE SEMICONDUCTOR SUBSTRATE

TECHNICAL FIELD

The present invention relates to a semiconductor light-emitting element such as a blue light-emitting diode (blue LED), blue laser diode (blue LD) or the like formed on a group III nitride semiconductor substrate, a group III nitride semiconductor substrate for use therefor, and a method for manufacturing such group III nitride semiconductor substrate.

BACKGROUND ART

Gallium nitride (GaN), aluminum nitride (AlN), AlGaN, InGaN, AlGaInN and other group III nitride semiconductors have been attracting attention as materials for semiconductor light-emitting element that emit blue light or ultraviolet light. Blue laser diodes (blue LDs) are applied to high-density optical disks and displays, and blue light-emitting diodes (blue LEDs) are applied to displays, illuminations and the like. Furthermore, ultraviolet LDs are expected to be useful for biotechnology, and ultraviolet LEDs are expected to be a source of ultraviolet light in fluorescent lamps.

Group III nitride semiconductor substrates (e.g., GaN substrates) for LDs and LEDs usually are formed by vapor-phase epitaxial growth. Such group III nitride semiconductor substrates are formed by, for example, letting group III nitride semiconductor crystals heteroepitaxially grow on sapphire substrates by vapor-phase epitaxial growth. However, the lattice constants of a sapphire substrate and a GaN crystal differ by 13.8% and their linear expansion coefficients differ by 25.8%. Therefore, the crystallinity of a GaN thin film obtained through heteroepitaxial growth by vapor-phase epitaxial growth is not sufficient. Moreover, the dislocation density of crystals obtained by this method is usually $10^8$ to $10^9$ cm$^{-2}$, and a decrease in dislocation density is an important task to be accomplished.

To accomplish this task, efforts have been made to reduce dislocation density, and for example, the ELOG (epitaxial lateral overgrowth) method has been developed. Although by using this method, dislocation density can be reduced to about $10^6$ to about $10^7$ cm$^{-2}$, the production process is troublesome.

Moreover, a method has been proposed in which a GaN thick film of relatively low dislocation is formed on a support substrate such as sapphire, GaAs substrate or the like by vapor phase epitaxy (usually HYPE), and then the aforementioned support substrate is removed by etching or polishing. However, these methods cannot sufficiently reduce dislocation density and result in a structure in which dislocation is locally concentrated. Therefore, it is difficult to produce LDs and LEDs of high intensity and high reliability with such substrates.

Recently, it has been discovered that using an alkali metal or alkaline earth metal as a flux component, GaN, AlN and the like can be synthesized at relatively low temperatures/pressures of 750 to 1000° C. and a few dozen atmospheres. Since this method enables substrates that have relatively large areas and few defects to be produced easily, research has been actively carried out (e.g., Patent Documents 1 and 2).

Meanwhile, doped group III nitride semiconductor substrates generally are needed to produce a variety of devices (e.g., Non-Patent Document 1). When a group III nitride semiconductor substrate is obtained using an alkali metal or alkaline earth metal as a flux, it is necessary to control various dopants. For a semiconductor light-emitting element, an n-type substrate usually is needed. In the flux method also, some dopants have been investigated (e.g., Patent Document 3). Most examples of methods for producing an n-type substrate according to the flux method are methods in which Si mainly is used as a dopant and methods involving autodoping. On the other hand, in vapor phase epitaxy, in addition to Si, also Ge is known as an n-type dopant. However, it is known that when Ge is used for doping in a high concentration (for example, $1\times10^{19}$ cm$^3$) by vapor phase epitaxy, pit-like defects are generated on a crystalline thin film and enhancing the mobility is troublesome (Non-Patent Documents 1 and 2).

Moreover, when a high-intensity LED is considered as a semiconductor light-emitting element, since the light emitted from the active layer is emitted in all directions, an n-type substrate of low light absorption is required as a group III nitride semiconductor substrate for use as a substrate. Furthermore, to attain an element with high efficiency and high reliability in a high-intensity LED, it is necessary to reduce non-luminescent centers that do not contribute to light emission and deterioration of the element. For this, a group III nitride substrate having a controlled dislocation density is needed. Moreover, to introduce a carrier into an active layer efficiently, a conductive substrate having a controlled dopant concentration is needed as a substrate. To realize an LED of a higher intensity, it is a great task simultaneously to enhance both heat discharge from an element and efficiency of extracting light to outside of the element. In contrast, although there have been attempts in the past to achieve a group III nitride substrate of high transparency (Patent Document 4), a group III nitride substrate that is transparent and has a suitable carrier concentration and low dislocation and a light-emitting element using such a group III nitride substrate are not known.

Furthermore, with respect to LDs, light is extracted in the direction parallel to the principal surface of a group III nitride substrate. Therefore, light and electric current concentrate more on the substrate compared with LEDs, and it is thus particularly important that the dislocation density of a substrate is low and the dopant concentration thereof is controlled. In addition, in an LD using a group III nitride substrate, due to light escaping from the active layer into the group III nitride substrate side and due to the fact that light escaping onto the p-side electrode is reflected on the group III nitride substrate and as a result escapes to the group III nitride substrate side, there is a problem that a disruption is observed in the emission pattern (interference pattern and substrate propagation mode) of the LD (Patent Document 5).

Patent document 1: JP 2002-293696 A
Patent document 2: JP 2003-206198 A
Patent document 3: WO04/013385
Patent document 4: 2005-213075 A
Patent document 5: 2005-45239 A
Non-Patent Document 1: S. Nakamura et. al., Jpn. J. Appl. Phys. Vol. 31 (1992), pp. 2883-2888
Non-Patent Document 2: W. Gotz et. al., Materials Science and Engineering Vol. B59 (1999), pp. 211-217

DISCLOSURE OF INVENTION

Problem to be Solved by the Invention

An object of the invention is to provide a semiconductor light-emitting element having an excellent light extraction property.

Another object of the invention is to provide a group III nitride semiconductor substrate having a controlled dopant concentration and controlled optical transparency.

Means for Solving Problem

In order to solve the above-described problems, the semiconductor light-emitting element of the present invention is characterized in that it comprises a substrate composed of a group III nitride semiconductor containing germanium (Ge) as a dopant; an n-type semiconductor layer formed on the substrate and composed of a group III nitride semiconductor; an active layer formed on the n-type semiconductor layer and composed of a group III nitride semiconductor; and a p-type semiconductor layer formed on the active layer and composed of a group III nitride semiconductor, wherein the substrate has a germanium (Ge) concentration of $2\times10^{17}$ to $2\times10^{19}$ $cm^{-3}$ and is produced in a nitrogen-containing atmosphere using a melt containing at least a group III element, an alkali metal or alkaline earth metal, germanium (Ge) and nitrogen.

Moreover, the group III nitride semiconductor substrate of the present invention is characterized in that it is composed of a group III nitride semiconductor containing germanium (Ge) as a dopant, the concentration of germanium (Ge) contained in the substrate is $2\times10^{17}$ to $2\times10^{19}$ $cm^{-3}$, and it is produced in a nitrogen-containing atmosphere using a melt containing at least a group III element, an alkali metal or alkaline earth metal, germanium (Ge) and nitrogen.

Furthermore, the method for manufacturing a group III nitride substrate of the present invention includes a growing step in which a surface of a seed crystal is brought into contact in a nitrogen-containing atmosphere with a melt containing at least a group III element, an alkali or alkaline earth metal, germanium (Ge) and nitrogen to react the group III element with the nitrogen and grow a group III nitride crystal on the seed crystal.

EFFECTS OF THE INVENTION

According to the present invention, a semiconductor light-emitting element can be obtained that has an excellent light extraction property. Moreover, according to the present invention, a group III semiconductor substrate can be obtained having a controlled dopant concentration and controlled transparency.

BRIEF DESCRIPTION OF DRAWINGS

FIG. 4 is a table showing a comparison of Ge doping in the present invention and Si doping.

Figure 1A:
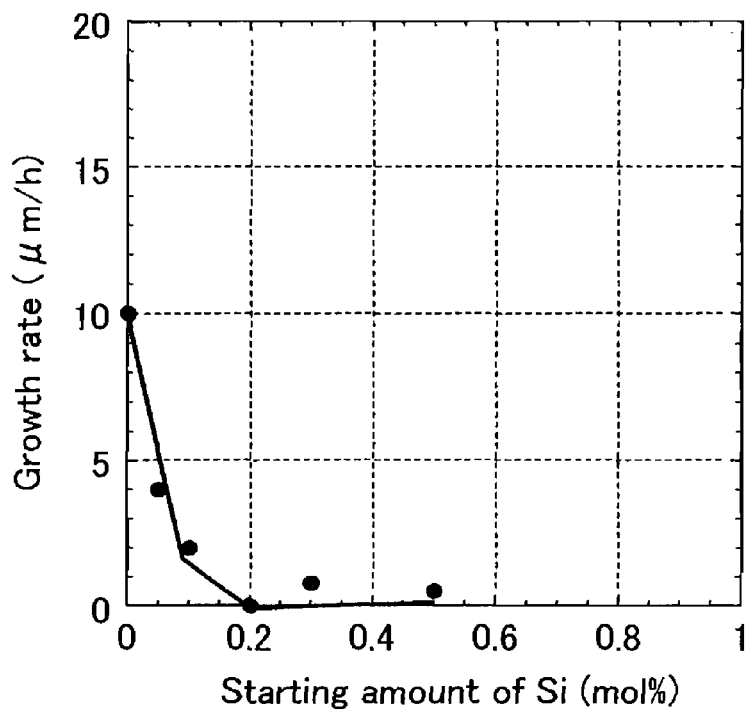
FIG. 1A is a graph showing the relationship between the starting amount of Si in a melt and the growth rate of a GaN crystal.

11 sapphire substrate
12 GaN thin film
14 Ge-doped GaN crystal
21 seed substrate
22 Ge-doped GaN crystal
26 GaN freestanding substrate
31 non-doped GaN freestanding substrate
34 GaN growth layer
37 GaN freestanding substrate
40 light-emitting diode
41 Ge-doped n-type GaN substrate
42 lightly-doped n-type semiconductor layer
43 n-side electrode
46 n-type semiconductor layer
47 active layer
48 p-type semiconductor layer
49 p-side electrode
50 light emitting diode
51 n-type substrate
52 lightly-doped n-type semiconductor layer
53 n-side electrode
54 reflective mirror
55 output light
56 n-type semiconductor layer
57 active layer
58 p-type semiconductor layer
59 p-side electrode
60 LED device
61 light emitting diode substrate
62 wiring
63 output light
64 solder bump
65 reflector/radiation block
67 translucent heat-dissipating substrate
68 lens
69 fluorescent substance layer
90 semiconductor laser
91 Ge-doped n-type substrate 92 n-type GaN layer
93 cladding layer
94 light guide layer
95 active layer
96 light guide layer
97 cladding layer
98 contact layer
99 insulating film
100 p-side electrode
101 n-side electrode

BEST MODE FOR CARRYING OUT THE
INVENTION

The semiconductor light-emitting element of the present invention comprises, as described above, a substrate composed of a group III nitride semiconductor containing germanium (Ge) as a dopant; an n-type semiconductor layer formed on the substrate and composed of a group III nitride semiconductor; an active layer formed on the n-type semiconductor layer and composed of a group III nitride semiconductor; and a p-type semiconductor layer formed on the active layer and composed of a group III nitride semiconductor, wherein the substrate has a germanium (Ge) concentration of $2\times10^{17}$ to $2\times10^{19}$ cm$^{-3}$ and is produced in a nitrogen-containing atmosphere using a melt containing at least a group III element, an alkali metal or alkaline earth metal, germanium (Ge) and nitrogen.

The semiconductor light-emitting element of the present invention contains a group III nitride semiconductor substrate of a low dislocation density that has the controlled germanium concentration most suitable for use as a light-emitting element substrate and is produced according to the flux method. Therefore, using the semiconductor light-emitting element of the present invention, light emission efficiency and reliability, for example, can be enhanced. Moreover, since the dopant is Ge in the substrate of the semiconductor device of the present invention, oxygen and Si pile-up on the substrate surface can be kept to a minimum. Therefore, when a device is created on the substrate, generation of new dislocation can be kept to a minimum at the interface between the substrate and a thin film formed on the substrate.

The germanium concentration in the thickness direction of the aforementioned substrate is preferably substantially uniform because a semiconductor light-emitting element containing such a substrate has more enhanced light emission efficiency and reliability.

The aforementioned n-type semiconductor layer preferably contains germanium (Ge) as a dopant. The germanium (Ge) concentration in the n-type semiconductor layer is preferably $2\times10^{17}$ to $2\times10^{19}$ cm$^{-3}$. By using the same type of dopant in the substrate and in the n-type semiconductor layer, the difference in surface energy at the interface between the substrate and the n-type semiconductor layer can be reduced. Thus, the n-type semiconductor layer formed on the n-type substrate has fewer defects, thereby enabling the light emission efficiency and reliability of the semiconductor device to be enhanced further.

It is preferable that the semiconductor light-emitting element of the present invention further comprises a resonator and that the germanium (Ge) concentration in the aforementioned substrate is $1\times10^{18}$ to $2\times10^{19}$ cm$^{-3}$. With a semiconductor light-emitting element of such a configuration, light propagated in the substrate mode is suppressed, and for example, a semiconductor laser with an excellent irradiation pattern of emitted light can be attained. Moreover, it is preferable that the optical absorption coefficient of the substrate at the center wavelength of the light emitted from the active layer is 70 cm$^{-1}$ or greater. With a semiconductor light-emitting element in which a substrate has a sufficiently large optical absorption coefficient, light propagated in the substrate mode is further suppressed, and for example, a semiconductor laser with a more uniform irradiation pattern of emitted light can be attained. It is preferable that the aforementioned substrate further contains at least one element selected from the group consisting of barium (Ba), strontium (Sr), ytterbium (Yb) and europium (Eu). Because a substrate further containing these elements can have a greater optical absorption coefficient, unnecessary light emitted, for example, after propagating through the substrate can be removed by absorption. Therefore, a semiconductor laser that shows a more advantageous emission pattern can be attained. The center wavelength of the aforementioned light is, for example, 400 to 600 nm.

In the semiconductor light-emitting element of the present invention, preferable is a semiconductor light-emitting element of a surface-emitting type in which the germanium (Ge) concentration of the aforementioned substrate is $2\times10^{17}$ to $5\times10^{18}$ cm$^{-3}$ and which outputs from the substrate side the light emitted from the aforementioned active layer. A semiconductor light-emitting element having such a configuration enables an n-type substrate to have excellent transparency, and for example, a semiconductor light-emitting element of a surface-emitting type having excellent optical transparency can be attained. Moreover, it is preferable that the optical absorption coefficient at the center wavelength of the light emitted from the active layer is 5 cm$^{-1}$ or less. Since the substrate of the semiconductor light-emitting element of the present invention contains germanium as a dopant and has excellent transparency, even when the optical absorption coefficient is as small as above, a light-emitting diode can be produced which has a high conductivity at a lower drive voltage than conventional diodes.

Next, the group III nitride semiconductor substrate of the present invention is characterized in that, as described above, it is a substrate composed of a group III nitride semiconductor containing germanium (Ge) as a dopant, the germanium (Ge) concentration in the substrate is $2\times10^{17}$ to $2\times10^{19}$ cm$^{-3}$, and it is produced in a nitrogen-containing atmosphere using a melt containing at least a group III element, an alkali metal or alkaline earth metal, germanium and nitrogen.

The group III nitride semiconductor substrate of the present invention has a controlled germanium concentration most suitable for use as a substrate of a light-emitting element. Furthermore, since it is a group III nitride semiconductor substrate produced according to the flux method, it has a low dislocation density and is of high quality. With the group III nitride semiconductor substrate of the present invention, since the dopant is Ge, the oxygen and Si pile-up on the substrate surface can be kept to a minimum. Therefore, with the group III nitride semiconductor substrate of the present invention, when a device is created on the substrate, generation of new dislocation can be kept to a minimum at the interface between the substrate and a thin film formed on the substrate, thereby enabling a semiconductor light-emitting element of high reliability to be produced.

It is preferable that the group III nitride semiconductor substrate of the present invention has a substantially uniform germanium concentration in the thickness direction. Such a semiconductor substrate enables a semiconductor light-emitting element having, for example, high light emission efficiency and reliability to be produced.

It is preferable that the dislocation density of the group III nitride semiconductor substrate of the present invention is not more than $1\times10^5$ cm$^{-2}$. Such a high-grade group III nitride semiconductor substrate enables, a semiconductor light-emitting element having, for example, high light emission efficiency and reliability to be produced.

It is preferable that the diameter of the group III nitride semiconductor substrate of the present invention is 20 mm or greater. And the thickness thereof is preferably 100 μm or greater. Such a large group III nitride semiconductor substrate enables, for example, a larger number of semiconductor light-emitting elements to be produced from one substrate, and thereby production efficiency can be enhanced.

It is preferable that the group III nitride semiconductor substrate of the present invention further contains at least one element selected from the group consisting of barium (Ba), strontium (Sr), ytterbium (Yb) and europium (Eu). A group III nitride semiconductor substrate containing these elements have, for example, a more controlled optical absorption coefficient in addition to a more controlled germanium concentration, making it possible to be a substrate having high optical transparency and conductively.

Next, the method for producing a group III nitride substrate of the present invention includes, as described above, a growing step in which a surface of a seed crystal is brought into contact in a nitrogen-containing atmosphere with a melt containing at least a group III element, an alkali or alkaline earth metal, germanium (Ge) and nitrogen to react the group III element with the nitrogen and grow a group III nitride crystal on the seed crystal.

According to the method for producing a group III nitride semiconductor substrate of the present invention, a high-grade group III nitride semiconductor substrate having the desired germanium (Ge) concentration can be produced.

In the method for producing a group III nitride semiconductor substrate of the present invention, the germanium (Ge) content relative to the group III element content in the melt is preferably 0.05 mol % to 15 mol % because a group III nitride semiconductor substrate having the desired germanium (Ge) concentration can thereby be produced efficiently. The aforementioned content is more preferably 0.5 mol % to 10 mol % because a group III nitride substrate having high PL intensity thereby can be produced.

It is preferable that the germanium (Ge) concentration in the thickness direction of the group III nitride crystal is substantially uniform because, for example, the yield of the production of the semiconductor light-emitting element can be enhanced.

It is preferable that, in the growing step, a group III nitride crystal is grown while reducing the growth rate of the group III nitride crystal from the surface of a seed crystal toward the surface of the group III nitride crystal. This is because a group III nitride semiconductor substrate having a Germanium (Ge) concentration substantially uniform in the direction of the thickness of the group III nitride crystal can be produced. It is preferable to increase the growth temperature in the growing step by 3 to 20° C. after the beginning of crystal growth. In this case, for example, the segregation coefficient of Ge gradually can be reduced during the growth due to the following two effects. That is, since the growth rate can be reduced gradually during the growth, due to the growth rate dependency of the segregation coefficient the value thereof can be reduced gradually. Moreover, by gradually increasing the growth temperature during the growth, for example, even when the concentration of Ge relative to Ga in the melt is increased, the extent of Ge taken in the crystal due to the effect of increasing the temperature can be reduced. Due to these two effects, even when the Ge concentration in the melt is increased, the Ge concentration in the thickness direction of the resulting crystal can be made substantially uniform. Furthermore, it is preferable to reduce the growth pressure in the growing step by 0.03 to 0.5 MPa after the beginning of crystal growth, thereby enabling the growth rate of the group III nitride crystal to be reduced and hence the segregation coefficient of Ge during the growth to be reduced gradually.

The doping concentration of germanium is preferably at the solid solubility limit. This is because a group III nitride semiconductor substrate having, for example, a substantially uniform germanium (Ge) concentration in the thickness direction can be produced.

Ambient temperature in the growing step is preferably 750 to 1000° C. This is because a group III nitride semiconductor substrate of a higher grade can be produced.

It is preferable that the melt further contains at least one element selected from the group consisting of barium (Ba), strontium (Sr), ytterbium (Yb) and europium (Eu). This is because a group III nitride semiconductor substrate having a controlled optical absorption coefficient in addition to a controlled germanium content can be produced.

EMBODIMENT 1

A method for producing a group III nitride semiconductor substrate according to the present invention is described below.

First, the desired amounts of a group III element, alkali metal element and/or alkaline earth metal element, and germanium are weighed out in an inert atmosphere such as in a glove box or the like and then introduced into a crucible. A seed crystal simultaneously is placed in the crucible as necessary. Any crystal can be used as the seed crystal. Usually, a seed crystal of a substrate in which a GaN crystal has been grown by vapor phase epitaxy on a sapphire or SiC crystal to the thickness of, for example, about 1 to about 20 μm can be used advantageously to produce a group III nitride semiconductor substrate having a greater area. Moreover, it is possible to use as a seed crystal, for example, a crystal having a diameter of 20 mm to 5 inches obtained by liquid phase or vapor phase epitaxy.

Next, the crucible is fixed to a reactor or pressure vessel. Here, the reactor and the pressure vessel may be separate containers or the reactor may serve as the pressure vessel. Hereinbelow, a description is given for when a reactor that also serves as a pressure vessel is used. A reactor is placed in an electric furnace. Nitrogen gas is supplied into the reactor via an external pipe. The desired pressure (e.g., about 2.5 to about 10 MPa) is given to the reactor. Then, the temperature of the electric furnace is set to, for example, 750 to 1000° C. and crystal growth is initiated. More preferable growth conditions when the group III nitride crystal is a GaN crystal are, for example, a growth pressure of 3 to 6 MPa and a growth temperature of 800 to 900° C.

Conventionally, in obtaining an n-type crystal in a method for growing a GaN crystal using a melt, doping of Si as in vapor phase epitaxy has been investigated (Patent Document 3). However, when solid Si was used as a dopant in liquid phase epitaxy, it often was observed that a GaN crystal does not grow on a seed crystal, heterogeneous nucleation occurs in a reactor, and crystal growth terminates.

In contrast, when Ge is used as a dopant as in the production method of the present invention, it is possible to grow a crystal having a thickness of about 1 to about 10 mm and a diameter of about 20 mm to about 2 inches by adopting, for example, a growth pressure of 3 to 6 MPa, a growth temperature of 800 to 900° C. and a growth time of 50 to 300 hours. Moreover, use of Ge as a dopant enables a crystal to grow with good reproducibility on a seed crystal. It is also possible, by controlling the amount of Ge (starting amount of Ge) relative to the amount of group III element contained in the melt to be, for example, about 0.05 mol % to about 15 mol %, to produce a group III nitride crystal having a germanium (Ge) concentration within the range of $2 \times 10^{17}$ to $2 \times 10^{19}$ ($cm^{-3}$). The starting amount of Ge in the melt is much higher than when Si is used as a dopant. Possible sources of Ge include Ge-containing gases and solid materials. For use in a high-pressure vessel, solid materials are preferable because they are free of toxicity and combustibility, i.e., ease to handle.

The results for reproducibility and crystal growth are different when Ge is used as a dopant as in the production method of the present invention and when Si is used as a dopant as in conventional methods. This may be attributed to the following reasons. Si is highly active in a nitrogen atmosphere. Moreover, at temperatures at which a group III nitride crystal grows, for example, $SiN_x$ powders are formed, and these powders serve as a heterogeneous nucleus. Herein, the term "heterogeneous nucleus" refers to particles that serve as a seed of crystal growth that are generated in the melt, on the surface of the melt, on the furnace wall, or the like places. When a heterogeneous nucleus is generated, the amount of crystal to be grown on the proper seed crystal is decreased significantly, resulting in a significantly reduced crystal growth rate. Moreover, particles that serve as a heterogeneous nucleus sometimes are incorporated as particles into a group III nitride crystal grown on a seed crystal, thereby making a good crystal unattainable. On the other hand, Ge is reasonably unstable in a nitrogen atmosphere at high temperatures, exists in the melt while being dissolved, and does not cause heterogeneous nucleation, and it appears that Ge in the melt is incorporated as a dopant when a crystal is grown on a seed crystal.

Furthermore, the present inventors have found that the proportion of the dopant Ge incorporated into a group III nitride crystal is small. That is, the segregation coefficient of germanium in a crystal growth method in which an alkali metal or alkaline earth metal is used as a flux component is, for example, about 0.01 to about 0.0001, i.e., very small. Herein, the term "segregation coefficient" refers to the molar ratio of Ge element to the group III element in the melt ((Ge/group III element) liq) relative to the molar ratio of Ge to the group III element in the crystal ((Ge/group III element) cry), and as by the following formula:

Segregation Coefficient=(Ge/group III element)cry/
(Ge/group III element)liq

Since the segregation coefficient of Ge is small as described above, a difference occurs in the germanium (Ge) concentration relative to Ge contained in the melt in the initial stage of crystal growth and in the terminal stage of crystal growth. Therefore, in order to perform doping uniformly throughout a crystal (for example, in the thickness direction of a crystal), it is effective to make the growth rate in the terminal stage of growth lower than that in the initial stage of growth. Examples of methods for reducing the growth rate include, for example, reducing the growth pressure during crystal growth by 0.03 to 0.5 MPa or setting the growth temperature in the terminal stage of growth higher than that in the initial stage of the growth. It is preferable to reduce the reaction pressure gradually, and it is preferable to reduce it at a rate of, for example, 0.0005 to 0.01 MPa/h and more preferably at a rate of 0.001 to 0.003 MPa/h. Moreover, when the growth temperature is increased, it is preferable to increase the growth temperature by, for example, about 3° C. to about 20° C., and the rate of increase is preferably, for example, 0.01 to 0.1° C./h, and more preferably 0.03 to 0.06° C./h.

When the change in growth pressure is within the aforementioned range, the germanium concentration in the thickness direction of a crystal can be made uniform, for example, without terminating the crystal growth, and by suitably reducing the growth rate during the crystal growth. Moreover, when the change in growth temperature is within the aforementioned range, similarly, the germanium concentration in the thickness direction of a crystal can be made uniform, for example, without terminating the crystal growth, and by sufficiently reducing the growth rate.

When doping is performed at a high concentration, it is effective that the starting amount of Ge in the melt is such that the germanium concentration in the group III nitride crystal to be grown is at the solid solubility limit of germanium. For example, when a GaN crystal is grown at 850 to 880° C., if the starting amount of Ge relative to Ga in the melt is, for example, about 5 mol % or greater, a group III nitride crystal can be produced in which the germanium concentration is at the solid solubility limit of germanium.

A crystal having a dopant concentration substantially uniform in the thickness direction of a substrate can be grown according to a method as described above. Herein, the phrase "dopant concentration substantially uniform in the thickness direction" means that the range of the dopant concentration (germanium concentration) in the thickness direction is within the range ±40% of the average of the measured values. Moreover, for the analysis of the dopant concentration (germanium concentration) in a crystal, for example, SIMS (secondary ion mass spectroscopy) can be used.

The dopant concentration in the thickness direction of a crystal can be measured by, for example, cleaving a wafer and using SIMS while changing the measuring points in the thickness direction of the cross section thereof. The average value is calculated using the measured values, and the range of concentration associated with the aforementioned average value can be determined based on the upper-limit value and the lower-limit value of the measured values.

Furthermore, to obtain a group III nitride crystal having excellent translucency, the doping concentration of Ge in a group III nitride crystal only has to be reduced. For example, the doping concentration of Ge of about $2 \times 10^{17}$ to about $5 \times 10^{18}$ ($cm^{-3}$) enables a crystal having a maximum optical absorption coefficient of 5 ($cm^{-1}$) or less at a wavelength of 400 nm to 600 nm to be obtained.

In addition, to obtain a group III nitride crystal having great optical absorbability, it is advantageous to increase the germanium (Ge) concentration in the melt. For example, it is advantageous that the Ge concentration of a group III nitride crystal is about $1 \times 10^{18}$ to about $2 \times 10^{19}$ ($cm^{-3}$). Furthermore, for example, by further adding to the melt at least one element among Ba, Sr, Yb and Eu, a group III nitride crystal having a greater optical absorption coefficient can be grown, and a group III nitride semiconductor substrate having a maximum optical absorption coefficient of 70 ($cm^{-1}$) or greater at a wavelength of, for example, 400 nm to 600 nm can be obtained easily. The starting amount of the aforementioned element(s) relative to group III element in the melt is, for example, 0.1 mol % to 10 mol % and preferably 0.5 mol % to 5 mol %. Furthermore, by growing a crystal using a melt further containing any of Ba, Sr, Yb and Eu, the growth rate can be increased, for example, to about twice to about 4 times the growth rate obtained when a crystal is grown using a melt containing none of the aforementioned elements.

Next, the group III nitride crystal thus grown is processed into a group III nitride semiconductor substrate according to the following procedure. After removing the seed crystal portion, a piece of the group III nitride crystal is cut out to have a thickness of, for example, about 200 to about 1200 μm and subjected to machine polishing, chemical mechanical polishing (CMP), and if necessary, surface etching and the like, thereby enabling the group III nitride crystal to be processed into a group III nitride semiconductor substrate. Cutting-out of the substrate is performed, for example, on planes that are substantially perpendicular within ±10° to the <0001>, <10-10> or <11-20> directions.

Next, an example of the mechanical polishing is ordinary mechanical polishing using diamond abrasive grains and a metal surface plate. An example of chemical mechanical polishing (CMP) is polishing using abrasive grains of colloidal alumina, colloidal silica or the like and a polishing pad or soft-metal surface plate. Moreover, etching is performed to remove an oxidized layer and work-affected layer attached to the surface. For example, a work-affected layer can be removed relatively easily by dry etching. Through these procedures, a group III nitride semiconductor substrate having a thickness of 100 to 1000 μm and a diameter of 20 mm or greater can be obtained. Here, a group III nitride crystal grown by liquid phase epitaxy generally has greater mechanical strength than crystals grown by HYPE or the like, and a group III nitride semiconductor substrate having a thickness of, for example, about 100 μm can be produced.

Hereinbelow, a method for producing a group III nitride semiconductor substrate according to the present invention is described in more detail using examples.

EXAMPLES

Example 1

In this example, Na was used as an alkali metal, Ga was used as a group III element, nitrogen gas was used as a nitrogen source, Ge was used as a dopant, and 10 mm per to side 1-inch GaN crystals were grown by LPE with various starting amounts of Ge in melts.

Used as a seed substrate was a substrate having a GaN layer with a thickness of 5 to 10 μm which had been grown by vapor phase epitaxy on a support substrate (sapphire). A GaN crystal containing Ge as a dopant was grown by vapor phase epitaxy on the seed substrate under conditions of a crystal growth temperature of 850 to 880° C. and a growth pressure of 2.5 to 4 MPa. The surface of the obtained crystal was subjected to machine polishing, mechanical chemical polishing, dry etching, etc., thereby obtaining a sapphire substrate-containing GaN substrate having a square 10 mm per side to a diameter of 1 inch. Moreover, when necessary, the sapphire substrate and the like were removed using methods such as laser lift-off, machine polishing, etc.

Figure 1B:
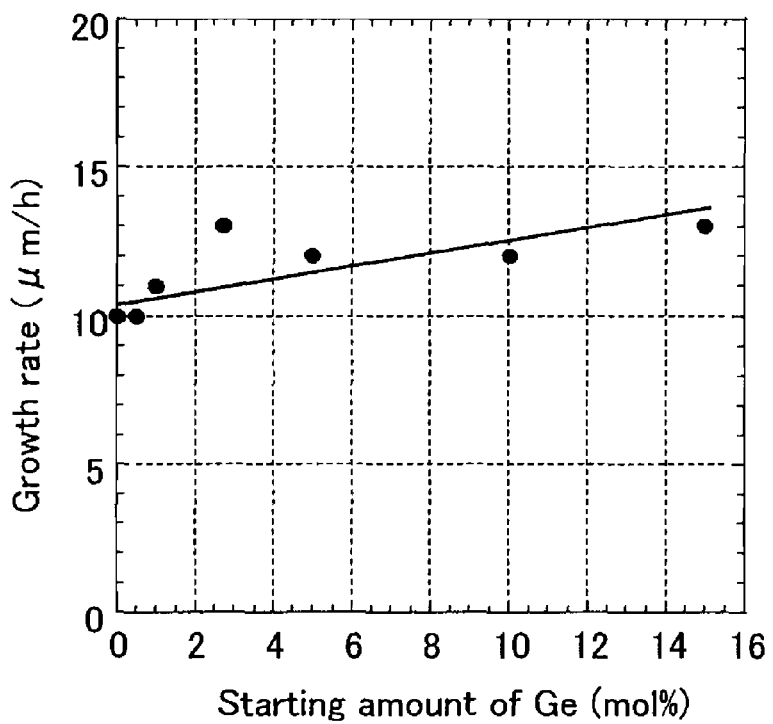
FIG. 1B is a graph showing an example of the relationship between the starting amount of Ge in a melt and the growth rate of a GaN crystal in the present invention.

GaN crystals of various dopant concentrations were produced by changing the starting amounts of Ge (mol %) relative to Ga contained in the melts. The results are shown in FIGS. 1A and 1B. FIGS. 1A and 1B are graphs showing the relationship between the starting amount of dopant relative to Ga and the dopant concentration in the obtained crystal. FIG. 1A shows the result obtained with Si, which is usually used as a dopant (comparative example), and FIG. 1B shows the result obtained with the production method of the present invention in which Ge is used as a dopant. As shown in FIG. 1A, when Si is added to the melt, the growth rate is decreased even with Si being added only in an amount of 0.05 mol %. This is because heterogeneous nucleation occurs during crystal growth and the amount for use in epitaxial growth on the seed substrate is reduced. Furthermore, in the comparative example depicted by FIG. 1A, the occurrence of heterogeneous nucleation was not necessarily reproducible. The growth rate and the amount of heterogeneous nuclei greatly varied in each sample. There was a case observed in which no crystal growth occurred.

When Ge was used as a dopant, no occurrence of heterogeneous nucleation was observed even when Ge was added in a molar ratio to Ga of up to about 15 mol %. Moreover, with the starting amount of Ge relative to Ga being within the range of 0.05 to 15 mol %, the growth rate was observed as having a slight upward trend as the starting amount was increased. This may be because Ge serves as a type of flux that enhances crystal growth upon being incorporated as a dopant into a crystal.

Figure 2A:
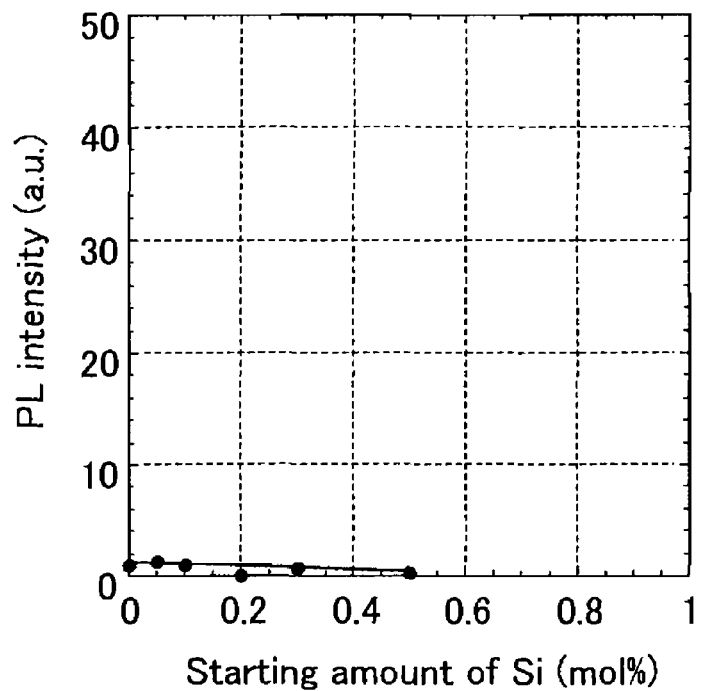
FIG. 2A is a graph showing the relationship between the starting amount of Si in a melt and the PL intensity of the obtained GaN crystal.
Figure 2B:
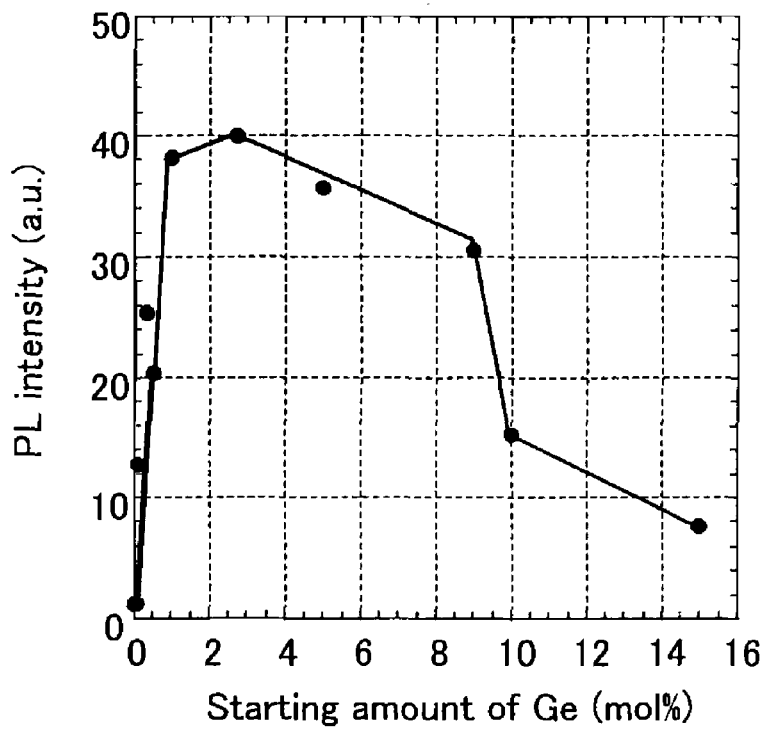
FIG. 2B is a graph showing an example of the relationship between the starting amount of Ge in a melt and the PL intensity of the obtained GaN crystal in the present invention.

FIGS. 2A and 2B show the relationship between the photoluminescence (PL) intensity and the starting amount of dopant. FIG. 2A is a graph showing the starting concentration dependency of PL intensity when Si was used as a dopant (comparative example), and FIG. 2B is a graph showing the starting concentration dependency of PL intensity in the production method of the present invention in which Ge was used as a dopant. As shown in FIG. 2A, because Si was not properly incorporated into the crystal or heterogeneous nucleation occurred, no enhancement of PL intensity was observed even when the starting amount of Si was increased.

On the other hand, no occurrence of heterogeneous nucleation was observed even when Ge was added in amounts up to 15 mol % relative to Ga. Moreover, as shown in FIG. 2B, the crystallinity of the obtained GaN appears to be good, and the PL intensity was increased about 10 to about 40 times that of the GaN crystal not containing Ge as a dopant. From this result, the Ge-doped crystal appears to have excellent crystal quality.

Figure 3:
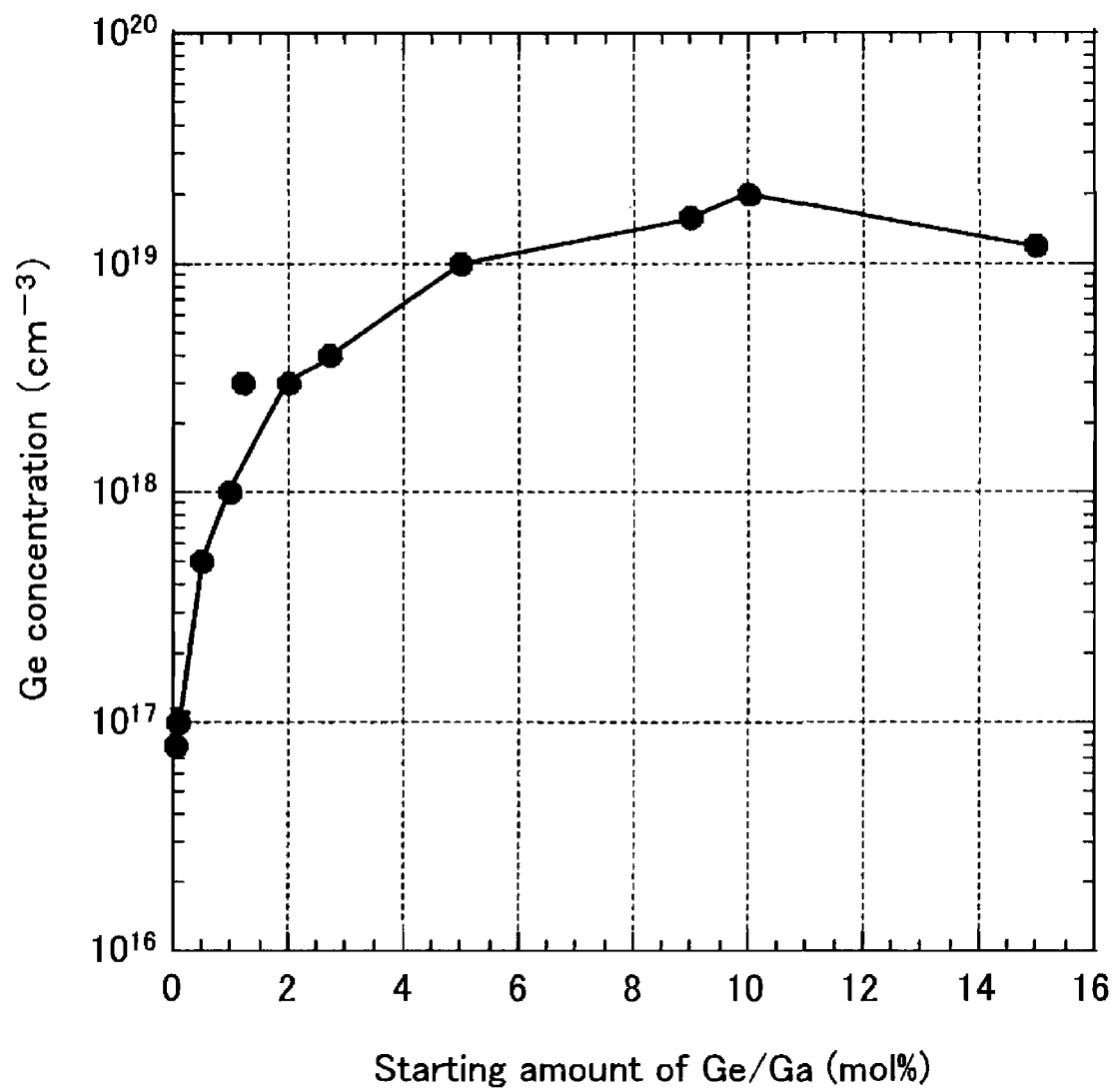
FIG. 3 is a graph showing an example of the relationship between the starting amount of Ge in a melt and the germanium (Ge) concentration of the obtained GaN crystal in the present invention.

FIG. 3 shows a relationship between the starting amount of Ge relative to Ga and the germanium concentration in the crystal. As shown in the figure, when the starting concentration of Ge relative to Ga was 0.05 to 15 mol %, a crystal having a dopant Ga concentration of $2 \times 10^{17}$ to $2 \times 10^{19}$ ($cm^{-3}$), which is effective particularly as a substrate for a light-emitting element, was obtained.

Moreover, when the starting amount of Ge relative to Ga was 0.5 mol % to 10 mol %, a crystal was obtained that was particularly effective for use in a light-emitting element because it had a dopant Ge concentration of $5 \times 10^{17}$ to $2 \times 10^{19}$ ($cm^{-3}$) and which had good crystallinity. This starting amount of Ge relative to Ga is extremely high compared with a usual starting amount of dopant, and it was not at all known heretofore that a good crystal can also be grown using a dopant in such a large amount. In addition, according to FIG. 3, when the starting amount of Ge relative to Ga is within the range of, for example, 0.5 mol % to 5 mol % compared with when the starting amount of Ge is 0.5 mol % or less, the change of the concentration of Ge incorporated into the crystal can be made small even when the concentration of Ge relative to Ga in the melt is changed. Furthermore, when the starting amount of Ge relative to Ga exceeded, for example, about 5 mol %, the Ge concentration in the obtained GaN crystal became nearly constant ($1 \times 10^{19}$ to $2 \times 10^{19}$ ($cm^{-3}$)). This concentration is considered to be the solid solubility limit of germanium in the GaN crystal at the growth temperature of 850 to 880° C. Therefore, by performing crystal growth within this range of the starting amount of Ge, a crystal which is uniformly doped in the thickness direction of the crystal can be grown.

FIG. 4 shows the result of summarizing the characteristics obtained when Si or Ge was used as a dopant in a group III nitride crystal grown from liquid phase using an alkali metal or alkaline earth element. It has become clear that when liquid phase growth using an alkali metal or alkaline earth metal was performed with Si, which is very common in vapor phase growth, it is difficult to grow a group III nitride crystal with good reproducibility. This may be because since Si is particularly active in an alkali metal or alkaline earth metal in a high-temperature nitrogen atmosphere, an Si nitride such as SiNx or the like is formed earlier than a group III nitride crystal and this Si nitride causes heterogeneous nucleation in liquid phase growth. On the other hand, Ge does not cause heterogeneous nucleation even when added in a proportion of up to 15 mol % relative to Ga and serves effectively as a dopant. Moreover, with the addition of Ge to the melt, the growth rate showed a slight upward trend. From this, it was confirmed that Ge has not only a function as a dopant but also a function as a solvent for crystal growth.

Example 2

Figure 5A:
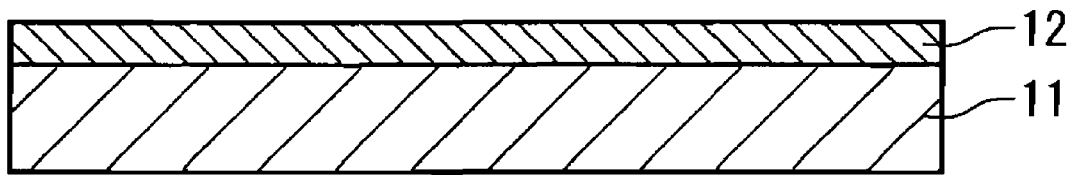
FIGS. 5A to 5C show a cross-sectional process drawing of the production process of the group III nitride semiconductor substrate of Example 2 of the present invention.
Figure 5B:
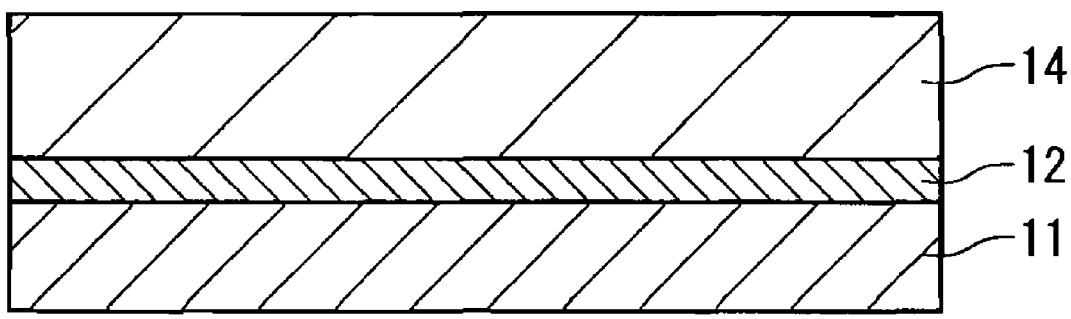
Figure 5C:
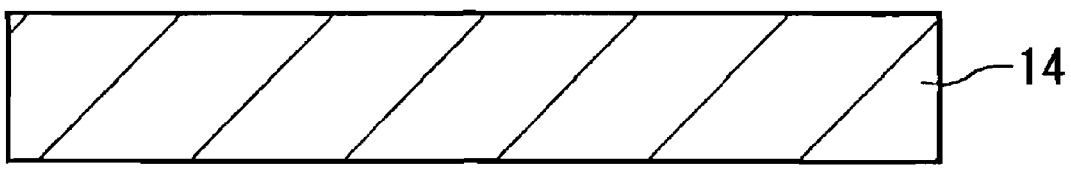

Another example of a method for producing a GaN substrate according to the present invention is described below using FIG. 5. Described is a case where a GaN substrate is grown using a Na flux, but basically the same method is applicable to other group III nitride crystals as well.

First, a flux, i.e., Na, and the starting materials, i.e., Ga and the desired proportion of Ge, and a seed substrate were introduced into a crucible. A substrate on which a GaN thin film 12 (thickness: 10 μm) had been grown from vapor phase on a sapphire substrate 11 having a diameter of 1 inch was used as a seed substrate. Here, in order to avoid, for example, the oxidation of Na, introduction of the starting materials and the seed substrate into the crucible and reactor is carried out in a glove box replaced with an inert gas such as nitrogen gas, Ar gas or the like. After placing the reactor in a crystal growth furnace, the reactor may be evacuated and then pressurized with nitrogen as necessary.

The conditions for growing a GaN crystal are, for example, a growth pressure of about 2 MPa to about 6 MPa and a growth temperature of about 750 to about 900° C. In case of a group III nitride crystal containing Al, the optimum growth conditions are a low pressure and a high temperature, and in case of a group III nitride crystal containing In, the optimum growth conditions are a high pressure and a low temperature. In this example, crystal growth was carried out at a growth temperature of 830 to 860° C. under a growth pressure of 3 to 4 MPa with a starting amount of Ge relative to Ga of 2.7 mol % for a growth time of 96 hours. As a result, it was possible to obtain a GaN crystal 14 (diameter: 1 inch) containing germanium as a dopant, having a thickness of 1.25 mm and having substantially no coloration. The growth rate was 13 μm/h.

This GaN crystal was sliced in the direction substantially perpendicular to the <0001> direction and subjected to mechanical polishing, chemical mechanical polishing, etching, etc., thereby producing a freestanding GaN substrate having a thickness of 100 to 400 μm and a diameter of 20 mm to 1 inch. These processing procedures enabled the surface roughness Ra of the produced GaN substrate to be 2 nm or less. The in-plane dopant Ge concentration of the produced GaN substrate was about $3 \times 10^{18}$ to $7 \times 10^{18}$ ($cm^{-3}$). The in-plane dopant Ge concentration of the GaN substrate was measured at any 3 points about 10 mm apart from each other on the surface of the GaN substrate. Of the aforementioned range, the minimum measured value is the lower limit and the maximum measured value is the upper limit (hereinbelow, this applies also to Examples 2 to 7). The PL intensity of the produced GaN substrate was 30 to 50 times the PL intensity of a GaN substrate not doped with germanium. Furthermore, the dislocation density of a portion of the GaN substrate containing germanium as a dopant was measured by etching. As a result, the dislocation density of the GaN substrate was $1 \times 10^3$ to $1 \times 10^6$ ($cm^{-2}$), and this GaN substrate was a substrate having a lower dislocation density than a GaN substrate produced by conventional HVPE.

Example 3

Figure 6A:
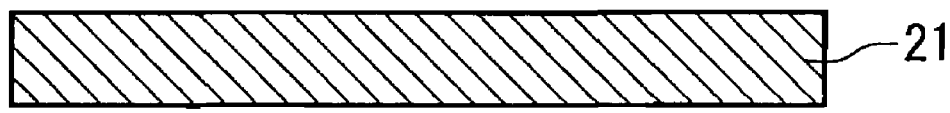
FIGS. 6A to 6C show a cross-sectional process drawing of the production process of the group III nitride semiconductor substrate of Example 3 of the present invention.
Figure 6B:
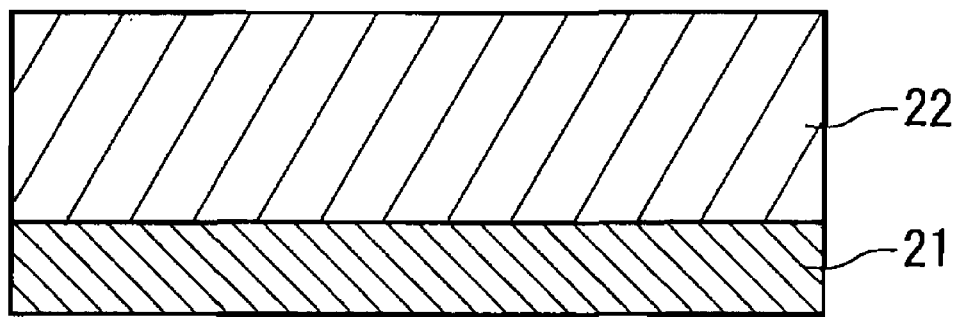
Figure 6C:
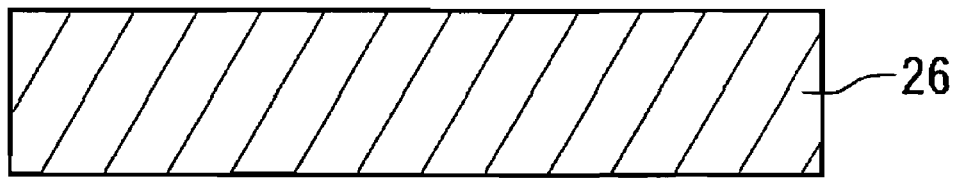

Another example of a method for producing a GaN substrate according to the present invention is described below using FIG. 6. A non-doped freestanding GaN substrate 21 produced according to the following method was used as a seed crystal. First, except that the diameter of the seed substrate was 2 inches and no germanium was doped, a substrate was grown on the seed substrate according to the same LPE process as in Example 2, and the sapphire substrate was removed thereafter by laser lift-off. Next, processing with polishing and etching was performed, thereby producing a freestanding GaN substrate having a thickness of 300 μm and a diameter of 2 inches. A GaN crystal was grown on this freestanding GaN substrate 21 under the same growth conditions as in Example 2. As a result, it was possible to epitaxially grow a GaN crystal 22 having a thickness of 1.5 mm.

The surface of the seed substrate 21 and the surface of the GaN crystal 22 were polished. Next, the GaN crystal 22 was sliced, the principal surface (Ga surface) of the obtained GaN substrate was subjected to mechanochemical polishing and, if necessary, dry etching or the like, thereby producing a freestanding GaN substrate 26 having a diameter of 2 inches and a thickness of 500 μm. It was possible to reduce the surface roughness Ra of the obtained GaN substrate to 2 nm or less.

The in-plane dopant Ge concentration of the produced freestanding GaN substrate was $3 \times 10^{18}$ to $10 \times 10^{18}$ ($cm^{-3}$). The PL intensity of the freestanding GaN substrate was 40 to 50 times the PL intensity of a GaN substrate not doped with germanium. Furthermore, the dislocation density of the produced freestanding GaN substrate was measured by etching. As a result, the dislocation density of the freestanding GaN substrate was $1 \times 10^4$ to $1 \times 10^5$ ($cm^{-2}$), and it was possible to produce a GaN substrate that had a dislocation density that is one or two orders smaller than that of GaN substrates produced by conventional HVPE.

Example 4

The fourth example according to the invention of the present application is described in the following. A non-doped or lightly Ge-doped freestanding substrate was used as a seed crystal. Except that the starting amount of Ge relative to Ga was about 0.1 to 0.5 mol %, a GaN crystal was grown under the same conditions as in Example 2. As a result, it was possible to obtain a GaN crystal having a diameter of 1 inch, a thickness of 1.0 mm, and substantially no coloration. The growth rate was 10 μm/h. By subjecting the obtained GaN crystal to slicing, polishing, etching, etc., a freestanding GaN substrate having a diameter of 1 inch and a thickness of 500 μm was produced.

The in-plane dopant Ge concentration of the freestanding GaN substrate was $3 \times 10^{17}$ to $6 \times 10^{17}$ ($cm^{-3}$). The PL intensity of the freestanding GaN substrate was 5 to 10 times the PL intensity of a GaN crystal not doped with germanium. Further, the dislocation density of the obtained freestanding GaN substrate was measured by etching. As a result, the dislocation density of the freestanding GaN substrate was $5 \times 10^3$ to $1 \times 10^5$ ($cm^{-2}$). In addition, the optical absorption coefficient at a wavelength of 400 to 600 nm of the freestanding GaN substrate was 5 $cm^{-1}$ or less. A group III nitride semiconductor substrate such as this is particularly of use as a substrate of a light-emitting device that extracts light of, for example, LED and the like.

Example 5

Figure 7A:
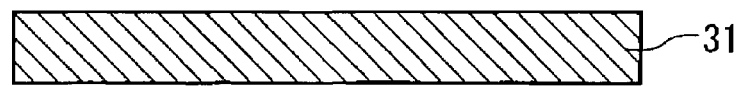
FIGS. 7A to 7C show a cross-sectional process drawing of the production process of the group III nitride semiconductor substrate of Example 5 of the present invention.
Figure 7B:
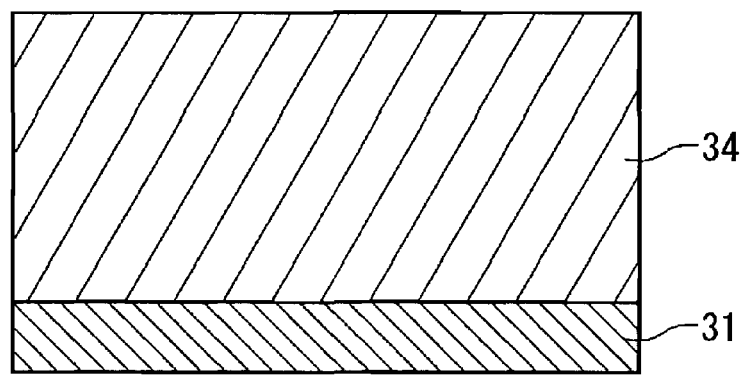
Figure 7C:
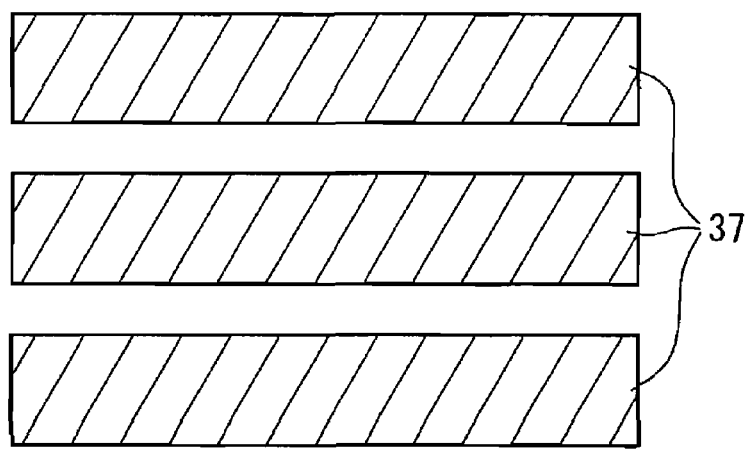

The fifth example according to the invention of the present application is described using FIG. 7.

In this example, crystal growth was carried out with the starting amount of Ge relative to Ga of 1 to 3 mol %, a non-doped freestanding GaN substrate 31 was used as a seed substrate, and the growth time was 300 hours. As a result, the obtained growth layer 34 was a GaN crystal having a thickness of 5 mm and a diameter of 2 inches.

The obtained GaN crystal was sliced to attain the desired thickness, for example, about 0.6 to about 1 mm. Furthermore, mechanical polishing, mechanochemical polishing, dry etching, etc., were performed, thereby enabling about 3 to 7 pieces of freestanding GaN substrates 37 having a thickness of 500 µm to be obtained.

The in-plane dopant Ge concentration of the freestanding GaN substrates 37 was $3\times10^{18}$ to $6\times10^{18}$ $(cm^{-3})$. The PL intensity of the freestanding GaN substrates was 30 to 40 times the PL intensity of a GaN substrate not doped with germanium. Furthermore, the dislocation density of a portion of the obtained freestanding GaN substrates was measured by etching. As a result, the dislocation density of the obtained freestanding GaN substrates was $1\times10^4$ to $1\times10^5$ $(cm^{-2})$, i.e., low dislocation.

In this example, used as a seed substrate was a GaN substrate of which the principal surface of growth was (0001). For example, by cutting out a GaN crystal in the direction perpendicular to the <10-10>±10° direction or the <11-20>±10° direction, or by growing a crystal using a seed substrate having an aforementioned plane orientation, a group III nitride semiconductor substrate having as its principal plane a (10-10)±10° plane or (11-20)±10° plane can be realized.

Example 6

The sixth example according to the invention of the present application is described below. In this example, except that a non-doped or low Ge-doped GaN which had been LPE-grown was used as a seed substrate and the starting amount of Ge relative to Ga was 10 mol %, a GaN crystal was produced in the same manner as in Example 3. As a result, a Ge-doped crystal having a thickness of 1.5 mm grew on the seed substrate over the growth time of 96 hours. The obtained GaN crystal was dark brown. The PL intensity of the obtained GaN crystal was about 10 times the PL intensity of a GaN crystal not doped with germanium. That is, it was possible to obtain a GaN crystal having good crystallinity and high optical absorbance. Moreover, the in-plane dopant Ge concentration of the obtained GaN crystal was $7\times10^{18}$ to $2\times10^{19}$ $(cm^{-3})$. This GaN crystal, when used as a substrate for a laser that extracts light in the direction parallel to the principal surface of the substrate, can remove by absorption the unnecessary light emitted after propagating through the substrate due particularly to its large optical absorption coefficient, and therefore this GaN crystal is very useful as a substrate for a laser.

Since the starting amount of Ge relative to Ga under these conditions is an amount exceeding the threshold for obtaining a GaN crystal having a doping concentration at the solid solubility limit, the dopant concentration of the obtained GaN crystal is usually considered to be uniform. Therefore, the reason there is a variation in dopant concentration in the plane of the obtained GaN crystal is thought to be the temperature dependency of the solid solubility limit due to the variation in concentration measured by SIMS and the in-plane distribution of crystal growth temperature.

Example 7

An example is described below in which a crystal was grown using a melt containing Ba in addition to Ge.

A GaN crystal was grown under the same conditions as in Example 2 except that the starting amount of Ge relative to Ga was 1 to 2 mol % and Ba was added in an amount of 1 to 4 mol % relative to Ga. The obtained GaN crystal was deep-colored in its entirety, and the optical absorbance thereof was greater than that of the GaN crystal obtained according to the method of Example 6. The maximum optical absorption coefficient at a wavelength of 400 to 600 nm of the obtained GaN crystal was 70 $cm^{-1}$ or greater. That is, due to the addition of Ba to the melt, it was possible easily to grow a GaN crystal having a greater optical absorption coefficient. It was possible to cut out a crystal having a thickness of 1 mm and obtain a GaN substrate having a diameter of 20 mm that has a large absorption coefficient.

The in-plane Ge concentration of the obtained crystal was $2\times10^{18}$ to $5\times10^{18}$ $(cm^{-3})$, and the in-plane Ba concentration thereof was about $0.2\times10^{17}$ to about $1\times10^{17}$ $(cm^{-3})$.

This GaN crystal, when used as a substrate for a laser that extracts light in the direction parallel to the principal surface of the substrate, can remove by absorption unnecessary light emitted after propagating through the substrate due particularly to its large optical absorption coefficient, and therefore this GaN crystal is very useful as a substrate for a laser.

Moreover, by adding Ba to the melt, a significant increase in growth rate can be attained, and compared with when Ba is not added, for example, the growth rate can be enhanced by 2 to 4 times. In other words, it was possible to attain a growth rate of, for example, 20 to 40 µm/h. An increase in growth rate by adding Ba was observed also when no Ge was doped.

As with Ba, an increase in growth rate and increase in optical absorption coefficient were also identified with respect to Sr, Eu and Yb.

Example 8

An example is described below in which the dopant concentration in the thickness direction of a crystal is made uniform. The growth temperature was constant at 860° C. and the initial amount of Ge relative to Ga was 2 mol %. A GaN substrate having a diameter of 2 inches produced according to the LPE method was used as a seed substrate. A GaN crystal was grown to the thickness of 3 mm on this seed substrate. A part of this 2-inch ingot crystal was vertically cleaved relative to the principal surface, and on the cleaved surface, the dopant Ge concentration in the thickness direction was measured using SIMS at a 1-mm pitch in the thickness direction of the crystal. Here, the measurement of dopant concentration was performed 3 times at substantially the same location, and the influence of location dependence was reduced by calculating the average value thereof. When growth was carried out under a constant growth temperature condition of 860° C., the Ge concentration in the thickness direction of the ingot crystal was varied within the range of $2\times10^{18}$ to $6\times10^{18}$ $(cm^{-3})$. The Ge concentration in this instance was $(4\pm2)\times10^{18}$ $(cm^{-3})$.

On the other hand, under the aforementioned growth conditions, when the growth temperature was raised after the beginning of growth from 860° C. by 3 to 20° C., the range of Ge concentration in the thickness direction of the obtained crystal was $(3\pm1)\times10^{18}$ (cm-3). Thus, by increasing the growth temperature, it was possible to attain a Ge concentration range which can be said to be substantially uniform in the thickness direction.

This is due to the fact that, although the Ge concentration relative to Ga in the melt is increased as the thickness of the grown crystal is increased, the segregation coefficient of Ge was effectually reduced by increasing the growth temperature. In this example, although the amount of Ge doping was made uniform in the thickness direction by increasing the growth temperature during crystal growth, an effect to make the Ge concentration in the thickness direction of the crystal substantially uniform was similarly identified also by lowering the growth rate by reducing the growth pressure during crystal growth (for example, from about 0.1 MPa to about 0.5 MPa).

EMBODIMENT 2

Figure 8:
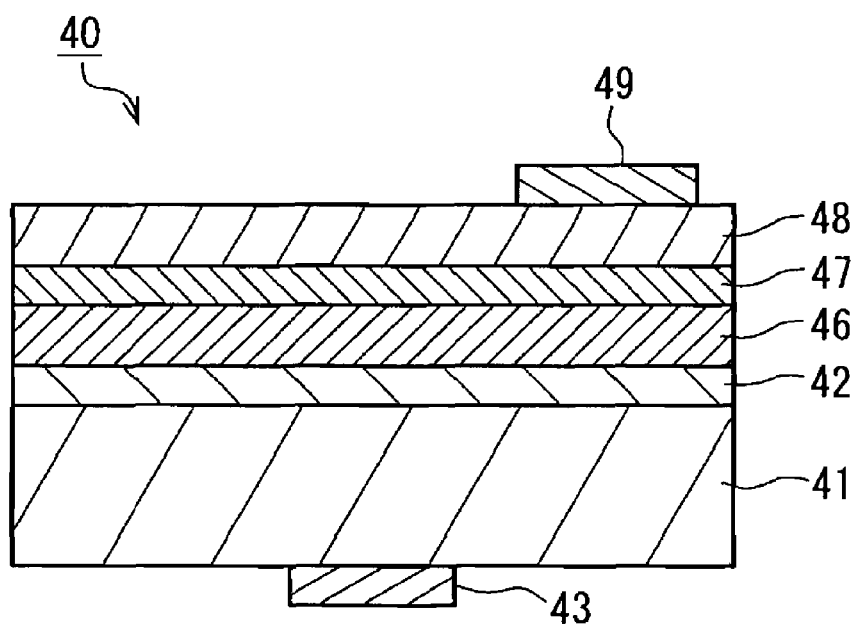
FIG. 8 is a cross-sectional drawing of an example of the structure of a light-emitting diode which is a semiconductor light-emitting element according to the present invention.

An embodiment of the semiconductor light-emitting element according to the present invention is described using as an example a light-emitting diode 40 in which a Ge-doped n-type substrate 41 (doping concentration: $1\times10^{18}$ (cm$^{-3}$)) was used as an n-type substrate with reference to FIG. 8. FIG. 8 is a cross-sectional drawing of an example of a light-emitting diode that is a semiconductor light-emitting element according to the present invention.

Since the dopant of the substrate of the semiconductor light-emitting element of the present invention is Ge, there is almost no Si or O pileup present on the substrate surface, unlike in substrates containing Si or O as a dopant. Moreover, even if a thin film is grown on the substrate by MOCVD or the like, generation of defects such as morphology abnormalities at the interface between the substrate and the thin film and dislocation newly produced at the aforementioned interface can be prevented. Si and Ge can be used as dopants of a group III nitride multilayer film grown on the n-type substrate 41, and Ge is more preferable when the chemical wettability and lattice matching with the n-type substrate 41 are taken into consideration.

Furthermore, Mg, Zn, etc., can be used as p-type dopants.

A lightly-doped n-type semiconductor layer 42 (thickness: 1 to 2 µm), an n-type semiconductor layer 46 (doping concentration: $1\times10^{18}$ cm$^{-3}$, thickness: 1 µm), an MQW or SQW InGaN active layer 47, a p-type semiconductor layer 48 (thickness: about 0.1 µm) are grown in this order on the aforementioned Ge-doped n-type substrate 41 by MOCVD. Next, photolithography, dry etching, etc., are performed to form a chip LED, and then an n-side electrode 43 and a p-side electrode 49 are formed, thereby producing the desired LED.

This LED device in which the n-type substrate 41 and the n-type semiconductor layer 46 are doped with Ge can achieve, for example, a light emission power of 2 to 8 mW at an operating voltage of 3.5 to 4.5 V and an operating current of 20 to 50 mA. This LED device can realize purple to green color having a luminescent center wavelength of 400 to 530 nm. This luminescent center wavelength can be controlled by, for example, changing the composition of the InGaN in the active layer.

Creating a device on the low-dislocation GaN substrate produced by liquid phase epitaxy enables an active layer to be attained that has lower dislocation compared with when a conventional substrate produced by vapor phase epitaxy is used. As a result, it is possible to attain an LED having high luminous efficiency, i.e., few non-luminescent centers, high output and high reliability.

Moreover, since the dopant of the substrate is Ge, compared with when Si or oxygen is used as a substrate dopant, the Si or O pileup at the interface between the thin film and the substrate is kept to a minimum, thereby enabling a device having, for example, fewer defects at the aforementioned interface to be attained. As a result, it is possible to attain a group III nitride light-emitting element having higher luminous efficiency and high reliability. Moreover, a light-emitting element in which a group III nitride semiconductor substrate is used has a substrate heat conductivity that is about 3 times greater than that of a device using sapphire and can accomplish a light-emitting element that is advantageous for increasing the output.

EMBODIMENT 3

Figure 9:
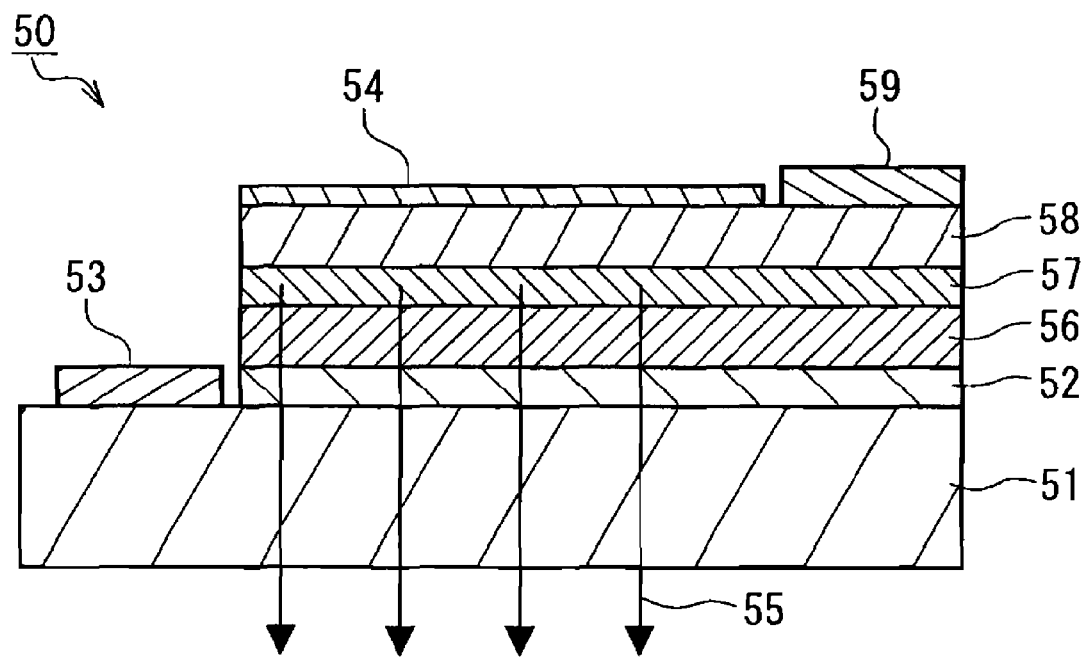
FIG. 9 is a cross-sectional drawing of an example of the structure of the second light-emitting diode of the present invention.

An embodiment in which an LED was produced using a GaN substrate is described using FIG. 9.

As an n-type substrate 51, a GaN substrate having a doping Ge concentration of $5\times10^{17}$(cm$^{-3}$), i.e., a relatively low doping concentration, is used. A lightly-doped n-type semiconductor layer 52 (thickness: 1 to 2 µm), an n-type semiconductor layer 56 (dopant concentration: $1\times10^{18}$ cm$^{-3}$, thickness: 1 µm), an MQW or SQW InGaN active layer 57, and a p-type semiconductor layer 58 (thickness: about 0.1 µm) are grown in this order on the GaN substrate by MOCVD. A chip LED is formed by performing photolithography, dry etching, etc. Next, an n-type electrode 53, a p-type electrode 59, and a reflector mirror 54 are formed, thereby obtaining the desired LED. For the mirror 54, for example, use of a thin film of Ag, Al or Pt enables a mirror of high reflectivity to be obtained.

It is important that the substrate has high transparency in the LED device of a surface-emitting type which extracts light from the n-type substrate 51 side as shown in FIG. 9. The Ge-doped GaN substrate can achieve transparency and conductivity simultaneously. By controlling the dopant Ge concentration to be $2\times10^{17}$ to $5\times10^{18}$ (cm$^{-3}$), the maximum absorption coefficient of the substrate at a wavelength of 400 to 600 nm of 5 cm$^{-1}$ or less can be achieved while attaining sufficient conductivity. Moreover, since the light reflected by the mirror also is emitted efficiently over the entire surface, an LED can be produced which has a light emission power of 3 to 10 mW, for example, at an operating voltage of 3.5 to 4.5 V and an operating current of 20 to 50 mA.

In addition, the LED device of this embodiment can be subjected to flip chip mounting and is advantageous for attaining an LED with a good heat release property as presented in Embodiment 4.

EMBODIMENT 4

Next, an LED having higher intensity using a LED similar to that of Embodiment 3 of the invention of the present application is described. In connection with conventional high-output LEDs, heat release from the side closer to the active layer was being investigated as the primary object. However, when giving higher intensity to LEDs and generation of heat from fluorescent materials in white LEDs are taken into consideration, it is effective to consider heat release from the side from which light is extracted.

The present embodiment is further described below using FIG. 10. An LED device as produced in Embodiment 3 is mounted on a reflector/radiation block 65 having a wiring 62 using solder bumps 64 and the like. Next, at least a translucent heat-dissipating substrate 67 is connected to the reverse face of a substrate 61 of the LED device 60 (in this case, the side on which light is extracted). When creating a white LED, a fluorescent material 69 is further placed over the translucent heat-dissipating substrate 67, and thereby a white LED excited by blue, purple, or ultraviolet light can be obtained.

Here, as the reflector/radiation block 65, a material is used in which a mirror is coated over the reflective surface side of a metal such as Cu, Al or the like, or a crystal or sintered body of Si, AlN, GaN, etc. Furthermore, as the translucent heat-dissipating substrate 67, a crystal or a transparent ceramics of AlN, GaN or $Al_2O_3$ is used. From the viewpoint of processability and transparency, an $Al_2O_3$ single crystal or an $Al_2O_3$ transparent ceramic is advantageous. Heat released from the reverse face (the side on which light is extracted) of the substrate 61 of the LED device 60 travels to the translucent heat-dissipating substrate 67 and further is released to the reflector/radiation block 65 disposed next to it, thereby enabling heat to be released efficiently from the side on which the light of the LED device is extracted.

Figure 10:
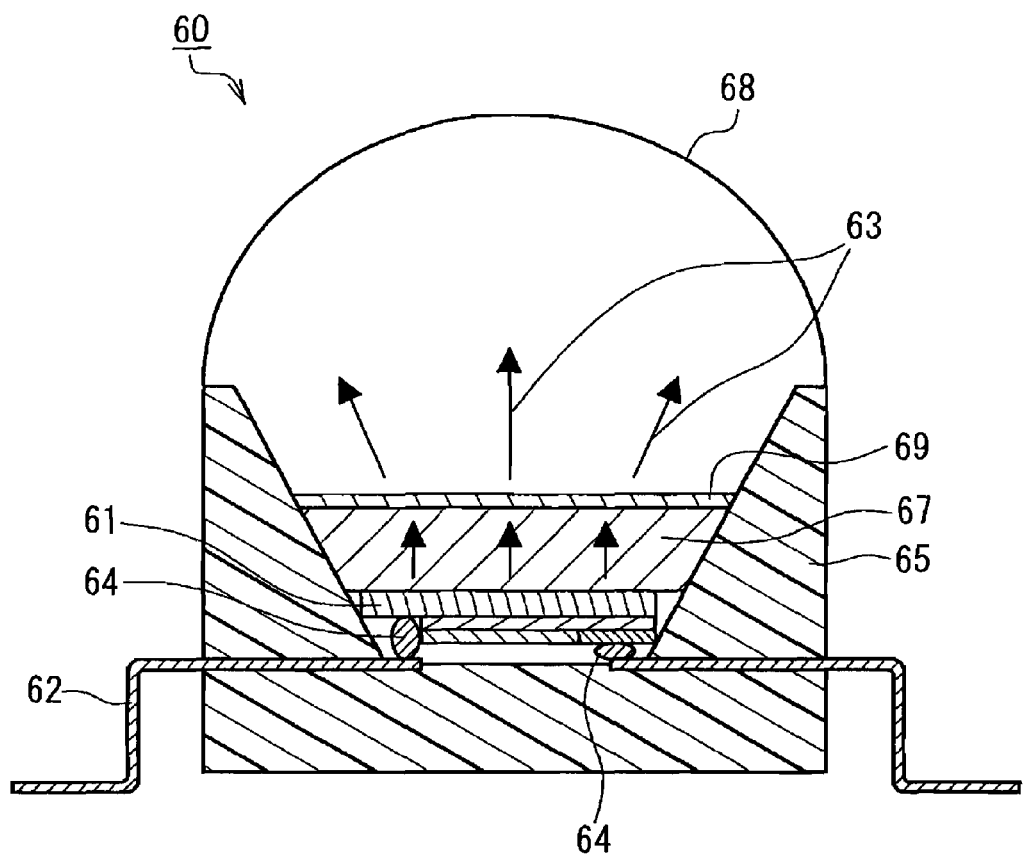
FIG. 10 is a cross-sectional drawing of an example of the structure of the third light-emitting diode of the present invention.

Furthermore, when the emission wavelength is, for example, in the 470 nm band giving blue light or about 380 nm giving ultraviolet light, a fluorescent material layer 69 is placed over at least one principal surface of the translucent heat-dissipating substrate 67 as shown in FIG. 10. As fluorescent materials, those that are conventionally known, such as YAG-based and nitride-based materials, can be used. As a result, a high-intensity white LED can be attained. In this case, heat generated in the fluorescent material layer 69 can also be efficiently released to the reflector/radiation block 65. Since the light emitted at the active layer is discharged efficiently to the front face via a lens 68, an LED can be attained that undergoes little decline in optical output by heat saturation even when the drive current is increased. Moreover, by tightly adhering the lens 68 to the fluorescent material layer 69 or the translucent heat-dissipating substrate 67, reflection of light at the interface between the lens 68 and the fluorescent material layer 69 or at the interface between the lens 68 and the translucent heat-dissipating substrate 67 can be reduced.

Moreover, with respect to the LED device 60 of this embodiment, even when it is a white LED which is excited by, for example, ultraviolet light, the light emitted from the active layer barely penetrates resin portion until it reaches the fluorescent material layer 69. Therefore, the LED device 60 of this embodiment enables an LED device to be attained that barely undergoes deterioration in resin and has high reliability in addition to having few substrate defects.

In this embodiment, a case described was where the n-type substrate of the LED device was a GaN substrate. Other group III nitride substrates are also usable. In particular, it is preferable to use a substrate which has less absorption of the wavelength used by the semiconductor light-emitting element. Thus, as a substrate for an LED within the ultraviolet region, it is also possible to use, for example, an $Al_xGa_{1-x}N$ ($0 \leq x \leq 1$) substrate containing a large amount of Al which barely absorbs light in a short wavelength region.

EMBODIMENT 5

Figure 11:
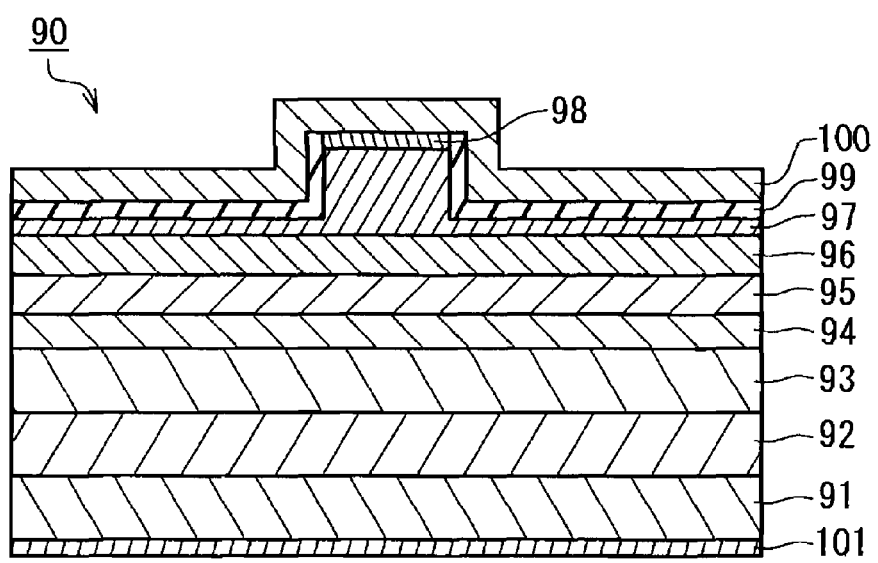
FIG. 11 is a cross-sectional drawing of an example of the structure of a semiconductor laser which is a semiconductor light-emitting element according to the present invention.

An example of producing a semiconductor laser (LD) using a GaN substrate is described using FIG. 11.

First, on a Ge-doped GaN substrate 91 as obtained in an above-described embodiment, an n-type GaN layer 92 doped with Si or Ge so as to attain a dopant concentration of, for example, $1 \times 10^{18}$ $cm^{-3}$ was formed. Here, although Si is usually used as the dopant of the n-type semiconductor layer 92, Ge is more preferable when chemical compatibility with the substrate and a like property are taken into consideration. By using Ge as the dopant of the n-type substrate 91, there is little Si or O pile-up at the interface between the substrate and the thin film unlike in substrates containing Si and O as dopants and this is therefore effective for reducing defects at the interface between the substrate and the thin film. This is as described above in Embodiment 2. Next, a cladding layer 93 composed of n-type $Al_{0.07}Ga_{0.93}N$ and a light guide layer 94 composed of n-type GaN are formed on the n-type GaN layer 92. A multiplex quantum well (MQW) containing a well layer (thickness: about 3 nm) composed of $Ga_{0.8}In_{0.2}N$ and a barrier layer (thickness: 6 nm) composed of GaN is formed as an active layer 95. A light guide layer 96 composed of p-type GaN, a cladding layer 97 composed of p-type $Al_{0.07}Ga_{0.93}N$, and a contact layer 98 composed of p-type GaN are formed. These layers can be formed according to a known method. A semiconductor laser 90 is a semiconductor laser of a double heterojunction type, and the energy gap of the well layer containing indium in the MQW active layer 95 is smaller than the energy gap of the n-type and p-type cladding layers containing aluminum. On the other hand, the well layer of the active layer 95 has the largest light refractive index, and the light refractive index is smaller for the light guide layers and the cladding layers in this order.

An insulating film 99 constituting a current injection area having a width of about 2 μm is formed on the upper part of the contact layer 98. A ridge part that serves as a current confinement part is formed on the upper part of the p-type cladding layer 97 and on the p-type contact layer 98.

A p-side electrode 100 that comes into ohmic contact with the contact layer 98 is formed on the upper side of the p-type contact layer 98. An n-side electrode 101 that comes into ohmic contact with the n-type GaN substrate 91 is formed on the n-type GaN substrate 91.

With respect to the semiconductor laser 90 produced according to the above-described method, when a specific voltage is applied in the forward direction between the p-side electrode 100 and the n-side electrode 101, holes are injected from the p-side electrode and electrons are injected from the n-side electrode into the MQW active layer. The holes and electrons recombine in the MQW active layer 95 and bring about optical gain, thereby enabling laser light having an optical power of 10 to 100 mW at the oscillation wavelength of 404 nm to be obtained.

Since the optical absorption of the n-type substrate 91 is high, the semiconductor laser 90 of this embodiment effectively can prevent, for example, a spike in the far-field beam pattern generated by light leaking into the n-type substrate 91 side.

By adjusting the dopant Ge concentration to be $1 \times 10^{18}$ to $2 \times 10^{19}$ ($cm^{-3}$) and by doping Ba and Sr, it is possible to more easily produce a Ge-doped GaN substrate having a maximal absorption coefficient of 70 $cm^{-1}$ or greater at a wavelength of 400 to 600 nm. Therefore, use of this substrate as the n-type substrate 91 of the semiconductor laser can prevent a spike without separately providing a light absorption layer.

Moreover, due to the use of a Ge-doped GaN substrate as the n-type substrate 91 which has a dislocation density of $1 \times 10^3$ to $1 \times 10^5$ ($cm^{-2}$), i.e., low defect, and which barely contains impurities such as oxygen, Si and the like on the substrate surface since the dopant is Ge, the reliability of the semiconductor laser device can be further enhanced. In addition, due to the use of Ge also as the dopant of the film grown by vapor phase epitaxy on the n-type substrate 91, dislocation generated at the interface between the substrate and the film thus formed and deterioration of surface morphology can be further reduced. In order to reduce defects at the interface, it is also effective to create as an intermediate layer an n-type layer having a low doping concentration of Ge between the n-type substrate 91 and the n-type semiconductor layer 92.

Figure 12A:
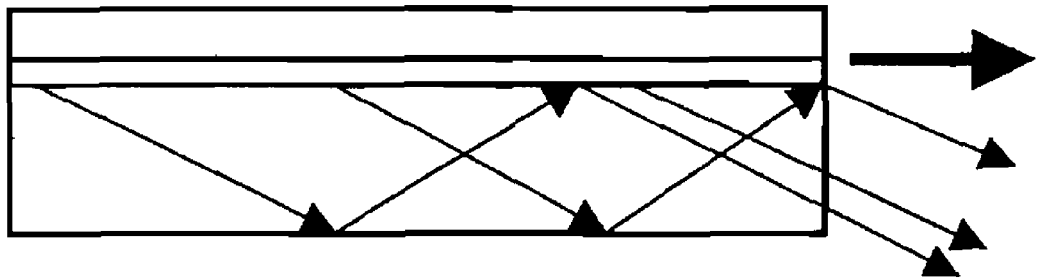
FIG. 12A is a schematic drawing showing a state of diffusion of stray light in a prior-art semiconductor laser.
Figure 12B:
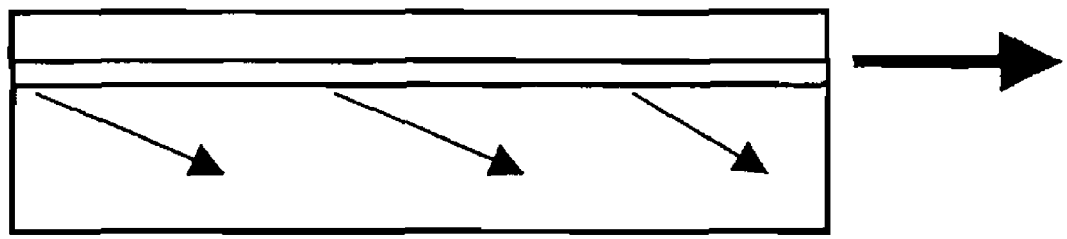
FIG. 12B is a schematic drawing showing a state of diffusion of stray light in the semiconductor laser of the present invention.
Figure 13A:
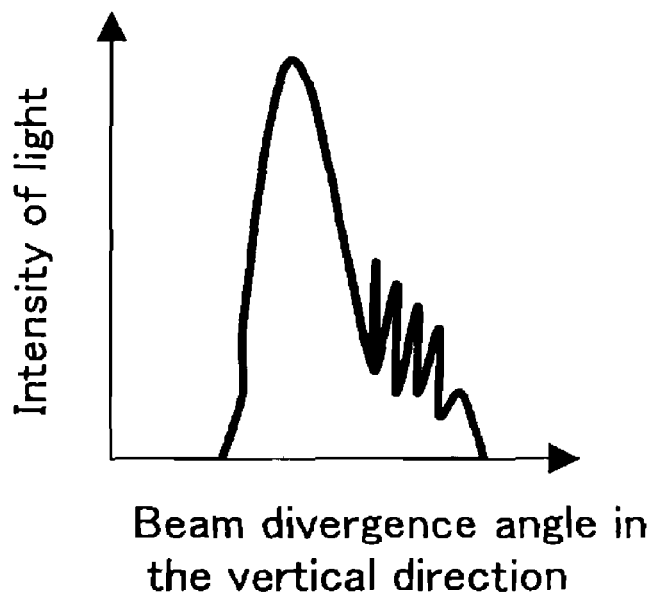
FIG. 13A is a schematic drawing showing the beam pattern of a prior-art semiconductor laser.
Figure 13B:
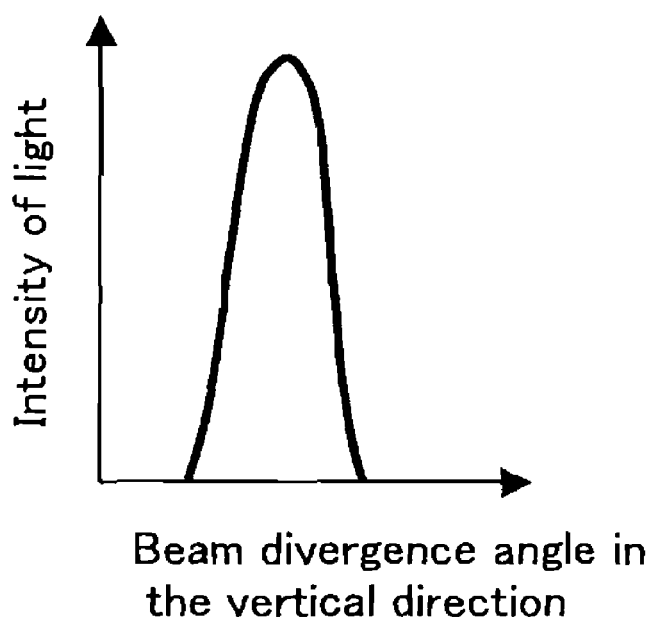
FIG. 13B is a schematic drawing showing the beam pattern of the semiconductor laser of the present invention.

For reference, the effect of preventing a spike in the far-field beam pattern is described below using FIG. 12 and FIG. 13. FIGS. 12A and 12B are schematic drawings showing states of diffusion of stray light in semiconductor lasers. FIG. 12A is a schematic drawing of a conventional semiconductor laser, and FIG. 12B shows an example of a schematic drawing of the semiconductor laser of the present invention. FIGS. 13A and 13B are schematic drawings showing beam patterns of semiconductor lasers. FIG. 13A shows the beam pattern of a conventional semiconductor laser, and FIG. 13B shows an example of the beam pattern of the semiconductor laser of the present invention.

When a semiconductor laser of a usual double heterostructure is created on the above-described GaN substrate, spikes often are observed in the far-field beam pattern as shown in FIG. 13A. The cause of this is that as shown in FIG. 12A since the GaN substrate 91 is transparent to light of the 400 nm wavelength band, light leaked from the active layer 95 and the cladding layer 93 is reflected onto the substrate and the electrode side and propagates as a substrate mode, thereby creating spikes in the emission pattern of light. Therefore, when a substrate having large optical absorption is used as the GaN substrate, light of the substrate propagation mode cannot propagate, and spikes in the far-field beam pattern can be removed. Here, the chip size in the direction of optical propagation of the LD is about 0.5 to about 2 mm. Therefore, when the optical absorption coefficient of the GaN substrate is, for example, 70 cm$^{-1}$, light of the substrate propagation mode can be absorbed almost completely as shown in FIG. 12B. As a result, spikes in the far-field beam pattern can be removed as shown in FIG. 13 B. Moreover, even when the optical absorption coefficient of the GaN substrate is high, it is also important that there is no large emission in a longer wavelength than the band-end emission. A group III nitride semiconductor substrate having a high optical absorption coefficient and good crystallinity can be produced by, for example, doping Ge in a high concentration (for example, $2\times10^{18}$ to $2\times10^{19}$ (cm$^{-3}$)), carrying out liquid phase epitaxy using a solvent containing Ba, Sr, Eu, Yb or the like an element, or using these methods in combination.

EMBODIMENT 6

Next, an LD using a group III nitride semiconductor substrate is described.

The LD is composed of a group III nitride semiconductor substrate and a group III nitride multilayer film formed thereon. Part of the group III nitride multilayer film contains at least a p-type semiconductor layer, an n-type semiconductor layer and an active layer. Ge is used as the dopant of the group III nitride semiconductor substrate. Here, the concentration of dopant Ge is $2\times10^{17}$ to $2\times10^{19}$ (cm$^{-3}$). It is thereby possible to achieve low resistance and prevention of deterioration in crystallinity in the LD device.

In order to improve heat release from the substrate side, the thickness of the substrate in the LD device is preferably, for example, less than 50 μm. When a group III nitride multilayer film is formed, a substrate having a thickness of 100 μm or greater is usually used, a thickness of less than 50 μm can be attained by eventually performing polishing on the reverse face. When liquid phase epitaxy is performed in particular, a group III nitride crystal is produced near thermal equilibrium and therefore has strong interatomic bonding. This is thus effective also for an LD device having a substrate having high mechanical strength and smaller thickness. Furthermore, since a crystal grown from a liquid phase has strong interatomic bonding, it is advantageous also from the point of enhancing the thermal conductivity of the LD device.

Ge is effective also as an n-type dopant of the group III nitride multilayer film. When Ge is used as a dopant of the group III nitride multilayer film, the chemical wettability and the lattice constant with the Ge-doped n-type substrate become near, and possibilities of defects newly generated especially at the epitaxial interface between the group III nitride multilayer film and the substrate can be reduced. In order further to reduce defects at the interface, it is also effective to create a low Ge-doped layer (for example, dopant concentration: $2\times10^{17}$ to $1\times10^{18}$ (cm$^{-3}$)) as an intermediate layer between the n-type substrate and the n-type semiconductor layer. The dopant Ge concentration in the n-type semiconductor layer in the group III nitride multilayer film is $2\times10^{17}$ to $2\times10^{19}$ (cm$^{-3}$), and therefore a group III nitride multilayer film having low resistance and good crystallinity can be attained.

INDUSTRIAL APPLICABILITY

The semiconductor light-emitting element of the present invention is applicable as a light source of, for example, optical disks, laser displays, illuminations, etc.

The invention claimed is:

1. A method for manufacturing a group III nitride semiconductor substrate comprising a growing step in which a surface of a seed crystal is brought into contact in a nitrogen-containing atmosphere with a melt comprising at least a group III element, sodium (Na), germanium (Ge) and nitrogen to react the group III element with the nitrogen and grow a group III nitride crystal on the seed crystal, wherein the germanium (Ge) content relative to the group III element content in the melt is 0.05 mol % to 15 mol %, and the substrate has a germanium (Ge) concentration of $2\times10^{17}$ to $2\times10^{19}$ cm$^{-3}$ and a dislocation density of not more than $1\times10^5$ cm$^{-2}$.

2. The method for manufacturing a group III nitride semiconductor substrate according to claim 1, wherein the germanium (Ge) content relative to the group III element content in the melt is 0.1 mol % to 10 mol %.

3. The method for manufacturing a group III nitride semiconductor substrate according to claim 1, wherein the germanium (Ge) content relative to the group III element content in the melt is 0.5 mol % to 9 mol %.

4. The method for manufacturing a group III nitride semiconductor substrate according to claim 1, wherein the germanium (Ge) concentration in a thickness direction of the group III nitride crystal is substantially uniform.

5. The method for manufacturing a group III nitride semiconductor substrate according to claim 1, wherein in the growing step the group III nitride crystal is grown while reducing a growth rate of the group III nitride crystal from a surface of the seed crystal toward a surface of the group III nitride crystal.

6. The method for manufacturing a group III nitride semiconductor substrate according to claim 5, wherein growth temperature is increased by 3 to 20° C. after crystal growth has started in the growing step.

7. The method for manufacturing a group III nitride semiconductor substrate according to claim 5, wherein growth pressure is lowered by 0.03 to 0.5 MPa after crystal growth has started in the growing step.

8. The method for manufacturing a group III nitride semiconductor substrate according to claim 1, wherein the concentration of dopant germanium is at its a solid solubility limit.

9. The method for manufacturing a group III nitride semiconductor substrate according to claim 1, wherein ambient temperature in the growing step is 750 to 1000° C.

10. The method for manufacturing a group III nitride semiconductor substrate according to claim 1, wherein the melt further comprises at least one element selected from the group consisting of barium (Ba), strontium (Sr), ytterbium (Yb) and europium (Eu).

11. The method for manufacturing a group III nitride semiconductor substrate according to claim 1, further comprising heating a group III element, a sodium (Na) and a solid material containing germanium (Ge) to prepare the melt.

12. The method for manufacturing a group III nitride semiconductor substrate according to claim 1, wherein the melt further comprises an alkali metal other than sodium (Na) and/or alkaline earth metal.

13. A group III nitride semiconductor substrate comprising germanium (Ge) as a dopant,
the substrate having a germanium (Ge) concentration of $2\times10^{17}$ to $2\times10^{19}$ cm$^{-3}$ and a dislocation density of not more than $1\times10^5$ cm$^{-2}$, and being produced in a method for manufacturing a group III nitride semiconductor substrate,
the method comprising a growing step in which a surface of a seed crystal is brought into contact in a nitrogen-containing atmosphere with a melt comprising at least a group III element, sodium (Na), germanium (Ge) and nitrogen to react the group III element with the nitrogen and grow a group III nitride crystal on the seed crystal, wherein the germanium (Ge) content relative to the group III element content in the melt is 0.05 mol % to 15 mol %.

14. The group III nitride semiconductor substrate according to claim 13 having a substantially uniform germanium concentration in a thickness direction.

15. The group III nitride semiconductor substrate according to claim 13 having a diameter of 20 mm or greater.

16. The group III nitride semiconductor substrate according to claim 13 having a thickness of 100 μm or greater.

17. The group III nitride semiconductor substrate according to claim 13 further comprising at least one element selected from the group consisting of barium (Ba), strontium (Sr), ytterbium (Yb) and europium (Eu).

18. A semiconductor light-emitting element comprising:
a substrate comprising a group III nitride semiconductor composed of germanium (Ge) as a dopant;
an n-type semiconductor layer composed of a group III nitride semiconductor formed on the substrate;
an active layer composed of a group III nitride semiconductor formed on the n-type semiconductor layer; and
a p-type semiconductor layer composed of a group III nitride semiconductor formed on the active layer,
the substrate having a germanium (Ge) concentration of $2\times10^{17}$ to $2\times10^{19}$ cm$^{-3}$ and a dislocation density of not more than $1\times10^5$ cm$^{-2}$, and the substrate being produced in a method for manufacturing a group III nitride semiconductor substrate,
the method comprising a growing step in which a surface of a seed crystal is brought into contact in a nitrogen-containing atmosphere with a melt comprising at least a group III element, sodium (Na), germanium (Ge) and nitrogen to react the group III element with the nitrogen and grow a group III nitride crystal on the seed crystal, wherein the germanium (Ge) content relative to the group III element content in the melt is 0.05 mol % to 15 mol %.

19. The semiconductor light-emitting element according to claim 18, wherein the germanium concentration in the thickness direction of the substrate is substantially uniform.

20. The semiconductor light-emitting element according to claim 19, wherein the substrate has a germanium (Ge) concentration of $1\times10^{18}$ to $2\times10^{19}$ cm$^3$ and the semiconductor light-emitting element further comprises a resonator.

21. The semiconductor light-emitting element according to claim 20, wherein the substrate has an optical absorption coefficient at the center wavelength of light emitted from the active layer of 70 cm$^{-1}$ or greater.

22. The semiconductor light-emitting element according to claim 21, wherein the substrate further comprises at least one element selected from the group consisting of barium (Ba), strontium (Sr), ytterbium (Yb) and europium (Eu).

23. The semiconductor light-emitting element according to claim 19, wherein the germanium (Ge) concentration in the substrate is $2\times10^{17}$ to $5\times10^{18}$ cm$^{-3}$ and the semiconductor light-emitting element is a surface-emitting type which outputs from a substrate side light emitted from the active layer.

24. The semiconductor light-emitting element according to claim 23, wherein the substrate has an optical absorption coefficient at the center wavelength of light emitted from the active layer of 5 cm$^{-1}$ or less.

25. The semiconductor light-emitting element according to claim 18, wherein the n-type semiconductor layer comprises germanium (Ge) as a dopant.

26. The semiconductor light-emitting element according to claim 25, wherein the n-type semiconductor layer has a germanium (Ge) concentration of $2\times10^{17}$ to $2\times10^{19}$ cm$^3$.

* * * * *

UNITED STATES PATENT AND TRADEMARK OFFICE
CERTIFICATE OF CORRECTION

PATENT NO. : 8,231,726 B2  
APPLICATION NO. : 12/161393  
DATED : July 31, 2012  
INVENTOR(S) : Minemoto et al.

Page 1 of 1

It is certified that error appears in the above-identified patent and that said Letters Patent is hereby corrected as shown below:

Column 23, line 3, claim 8: after "is at" delete "its".
Column 24, line 26, claim 20: delete "$cm^3$" and insert --$cm^{-3}$--.

Signed and Sealed this  
Twenty-ninth Day of January, 2013

David J. Kappos  
*Director of the United States Patent and Trademark Office*